United States Patent
Lee et al.

(10) Patent No.: US 9,418,739 B2
(45) Date of Patent: Aug. 16, 2016

(54) MEMORY DEVICES AND METHODS OF OPERATING THE SAME

(71) Applicants: Yong-Kyu Lee, Hwaseong-Si (KR); Yeong-Taek Lee, Seoul (KR)

(72) Inventors: Yong-Kyu Lee, Hwaseong-Si (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/616,806

(22) Filed: Feb. 9, 2015

(65) Prior Publication Data

US 2015/0287460 A1 Oct. 8, 2015

(30) Foreign Application Priority Data

Apr. 4, 2014 (KR) ........................ 10-2014-0040745

(51) Int. Cl.
*G11C 11/00* (2006.01)
*G11C 13/00* (2006.01)
*G11C 11/56* (2006.01)

(52) U.S. Cl.
CPC .......... *G11C 13/0069* (2013.01); *G11C 13/004* (2013.01); *G11C 13/0033* (2013.01); *G11C 11/5678* (2013.01); *G11C 11/5685* (2013.01); *G11C 13/0004* (2013.01); *G11C 13/0007* (2013.01); *G11C 2013/0054* (2013.01); *G11C 2013/0071* (2013.01); *G11C 2213/71* (2013.01); *G11C 2213/72* (2013.01)

(58) Field of Classification Search
CPC ........... G11C 13/0007; G11C 13/0069; G11C 13/004; G11C 2013/009; G11C 5/063; G11C 2013/0054; G11C 5/02; G11C 5/147; G11C 2013/0083; G11C 11/56; G11C 13/0002; G11C 13/0023; G11C 13/0026
USPC ............... 365/148, 189.06, 211, 189.09, 100, 365/163, 175, 189.16, 205, 226, 230.06
See application file for complete search history.

(56) References Cited

U.S. PATENT DOCUMENTS

| | | | |
|---|---|---|---|
| 7,372,718 B2 | 5/2008 | Nagao et al. | |
| 8,154,909 B2 | 4/2012 | Azuma et al. | |
| 8,233,327 B2 | 7/2012 | Wang | |
| 8,379,432 B2 | 2/2013 | Maejima et al. | |
| 2012/0020142 A1 | 1/2012 | Yu et al. | |
| 2012/0039110 A1* | 2/2012 | Maejima ............ | G11C 13/0004 365/148 |
| 2013/0208529 A1 | 8/2013 | Tomotani et al. | |
| 2013/0223133 A1 | 8/2013 | Azuma et al. | |
| 2013/0250657 A1 | 9/2013 | Haukness et al. | |

FOREIGN PATENT DOCUMENTS

| | | |
|---|---|---|
| JP | 2010073236 | 4/2010 |
| KR | 1212746 | 12/2012 |

* cited by examiner

*Primary Examiner* — Thong Q Le
(74) *Attorney, Agent, or Firm* — Volentine & Whitt, PLLC

(57) ABSTRACT

Methods of operating a memory device include; applying a first set write voltage to a selected first signal line connected to a selected memory cell, applying a first inhibition voltage to non-selected first signal lines connected to non-selected memory cells, and controlling a first voltage of a selected second signal line connected to the selected memory cell to be less than the first set write voltage, and a difference between the first inhibition voltage and the first voltage is less than a threshold voltage of the selection element.

20 Claims, 19 Drawing Sheets

EL1  DS  EL2

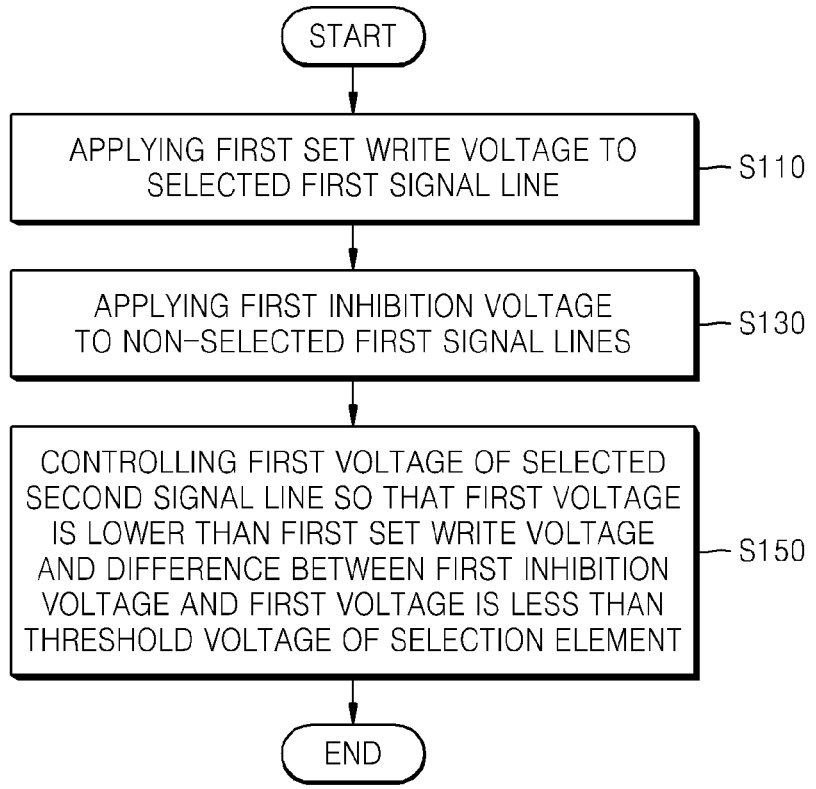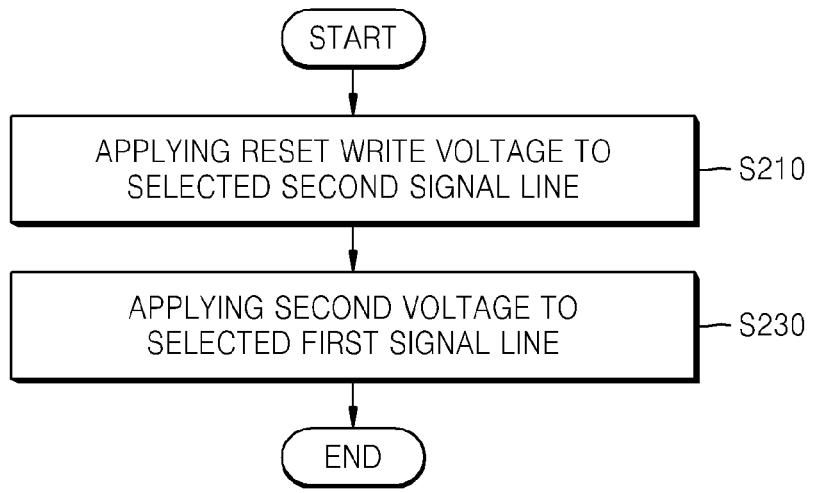

MEMORY DEVICES AND METHODS OF OPERATING THE SAME

CROSS-REFERENCE TO RELATED APPLICATION

This application claims the benefit of Korean Patent Application No. 10-2014-0040745, filed on Apr. 4, 2014, in the Korean Intellectual Property Office, the disclosure of which is incorporated herein in its entirety by reference.

BACKGROUND

The inventive concept relates to semiconductor devices and methods of operating same. More particularly, the inventive concept relates to memory devices including resistive memory cells and methods of operating same.

Next generation memory devices having nonvolatile characteristics without aid of refresh operations have been continuously developed with the need of high integration density and low power consumption of memory devices. Demands continue for next generation memory devices designed to have high integration density like dynamic random access memory (DRAM) devices, nonvolatile data retention characteristic like flash memory devices, and high speed data access like static random access memory (SRAM) devices. Phase change random access memory (PRAM or PcRAM) devices, nano floating gate memory (NFGM) devices, polymer random access memory (PoRAM) devices, magnetic random access memory (MRAM) devices, ferroelectric random access memory (FRAM or FeRAM) devices and resistive random access memory (RRAM or ReRAM) devices are very attractive as candidates of the next generation memory devices.

SUMMARY

The inventive concept provides semiconductor devices and methods of operating the same.

According to an aspect of the inventive concept, there is provided a method of operating a memory device including a including memory cells disposed at respective intersections of first signal lines and second signal lines, wherein each memory cell includes a variable resistor and a selection element. The method includes; applying a first set write voltage to a selected first signal line connected to a selected memory cell among the memory cells, applying a first inhibition voltage to non-selected first signal lines connected to non-selected memory cells among the memory cells, and controlling a first voltage of a selected second signal line connected to the selected memory cell to be less than the first set write voltage, and a difference between the first inhibition voltage and the first voltage is less than a threshold voltage of the selection element.

According to an aspect of the inventive concept, there is provided a method of operating a memory device including; applying a read voltage to a selected bit line connected to a selected memory cell among the memory cells, and comparing a voltage level of a selected word line connected to the selected memory cell with a reference voltage to read a data value stored in the selected memory cell, wherein a read current flows through the selected memory cell when the read voltage is applied to the selected bit line, and the read current flows to a ground voltage terminal through a read driver included in the sense amplification unit.

According to an aspect of the inventive concept, there is provided a semiconductor device including; a memory cell array including memory cells, each including a variable resistor and a selection element and being disposed at respective intersections of first signal lines and second signal lines, wherein the memory cells include a selected memory cell connected to a selected first signal line and a selected second signal line, and a write driver connected to one of the selected first signal line and selected second signal line having a lower voltage level to supply a write current to the selected memory cell.

BRIEF DESCRIPTION OF THE DRAWINGS

Embodiments of the inventive concept will be more clearly understood from the following detailed description taken in conjunction with the accompanying drawings in which:

FIG. 19 is a flowchart illustrating a method of operating a memory device according to an embodiment of the inventive concept;

FIG. 20 is a flowchart illustrating a method of operating a memory device according to another embodiment of the inventive concept;

DETAILED DESCRIPTION OF EMBODIMENTS

Various embodiments of the inventive concept will now be described in some additional detail with reference to the accompanying drawings. The inventive concept may be embodied in many different forms and should not be construed as being limited to only the illustrated embodiments. Rather, the following embodiments are provided so that this disclosure will be thorough and complete and will fully convey the scope of the inventive concept to those skilled in the art. Throughout the written description and drawings like reference numbers and labels are used to denote like or similar elements.

The terminology used herein is for the purpose of describing particular embodiments only and is not intended to limit the inventive concept. As used herein, the singular terms "a," "an" and "the" are intended to include the plural forms as well, unless the context clearly indicates otherwise. It will be understood that the terms "comprises", "comprising,", "includes", "including", "have" and/or "having" when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "and/or" includes any and all combinations of one or more of the associated listed items. Moreover, expressions such as "at least one of," when preceding a list of elements, modify the entire list of elements and do not modify the individual elements of the list.

Figure (FIG.) 1 is a general block diagram illustrating a memory system according to an embodiment of the inventive concept.

Figure 1:
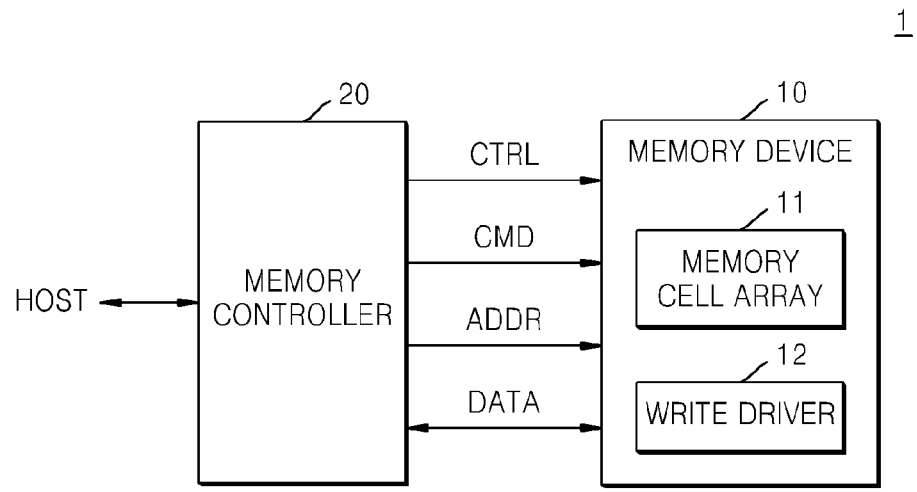
FIG. 1 is a block diagram illustrating a memory system according to an embodiment of the inventive concept.

Referring to FIG. 1, the memory system 1 includes a memory device 10 and a memory controller 20, where the memory device 10 includes a memory cell array 11 and a write driver 12.

The memory controller 20 may be used to control the operation of the memory device 10 in order to "read" data stored in the memory device 10, and/or "write" externally-provided data in the memory device 10 in response to corresponding read/write requests from a host. In the illustrated example of FIG. 1, the memory controller 20 provides the memory device 10 with an address signal ADDR, a command signal CMD and/or a control signal CTRL in order to control the respective execution of a program (or write) operation, a read operation, and/or an erase operation by the memory device 10. "Write data" to be programmed to the memory device 10 may be received from the memory controller 20 during a program operation, and "read data" is retrieved from the memory device 10 and communicated to the memory controller 20 during a read operation.

Although not shown in the drawings, the memory controller 20 may be configured to include a Random Access Memory (RAM), such as a DRAM or SRAM, a processing unit, a host interface, a memory interface, etc., where the RAM is used as an operating memory by the processing unit and the processing unit controls the overall operation of the memory controller 20. The host interface may be used to implement one or more protocol(s) for data communication between the host and memory controller 20. For example, the memory controller 20 may be configured to communicate with the host through at least one of a universal serial bus (USB), a multi-media card (MMC), a peripheral component interconnect express (PCI-E), an advanced technology attachment (ATA), a serial-ATA, a parallel-ATA, a small computer system interface (SCSI), an enhanced small device interface (ESDI) and an integrated drive (or device) electronics (IDE).

The memory cell array 11 includes a plurality of memory cells (not shown) disposed at the respective intersections of first and second signal lines (e.g., "word lines" and "bits lines").

In certain embodiments of the inventive concept, each of the memory cells will be a resistive memory cell including a variable resistor, such as a Resistive RAM (RRAM), Phase-change RAM (PRAM or Magnetic RAM (MRAM). The embodiments described hereafter assume the use of resistive memory cells, however other types of non-volatile memory cells might alternately or additionally be used.

The memory cell array 11 may be arranged with a planar structure, or a vertical structure in various embodiments of the inventive concept.

In FIG. 1, the write driver 12 may be selectively connected to a signal line having a relatively low voltage level among first and second signal lines connected to a "selected memory cell" in order to supply a write current to the selected memory cell. For example, if a high voltage signal is applied to the first signal line and a low voltage signal is applied to the second signal line during a write operation directed to a selected (resistive) memory cell, the write driver 12 will be connected to the second signal line. Moreover, if a low voltage signal is applied to the first signal line and a high voltage signal is applied to the second signal line during the write operation, the write driver 12 will be connected to the first signal line.

The memory controller 20 and the memory device 10 may be commonly integrated in a single semiconductor device, such as the type conventionally used in various memory cards. For example, the memory controller 20 and memory device 10 may be integrated in a single semiconductor device that is configured as a personal computer memory card international association (PCMCIA) card, a compact flash (CF) card, a smart media card (SMC), a memory stick, a multi-media card (MMC) such as a reduced size multi-media card (RS-MMC) or a MMCmicro, a secure digital (SD) card such as a mini-CD card or a micro-CD card, or a universal flash storage (UFS) unit. Alternatively, the memory controller 20 and the memory device 10 may be integrated in a single semiconductor device configured as a solid state drive (SSD) system.

Figure 2:
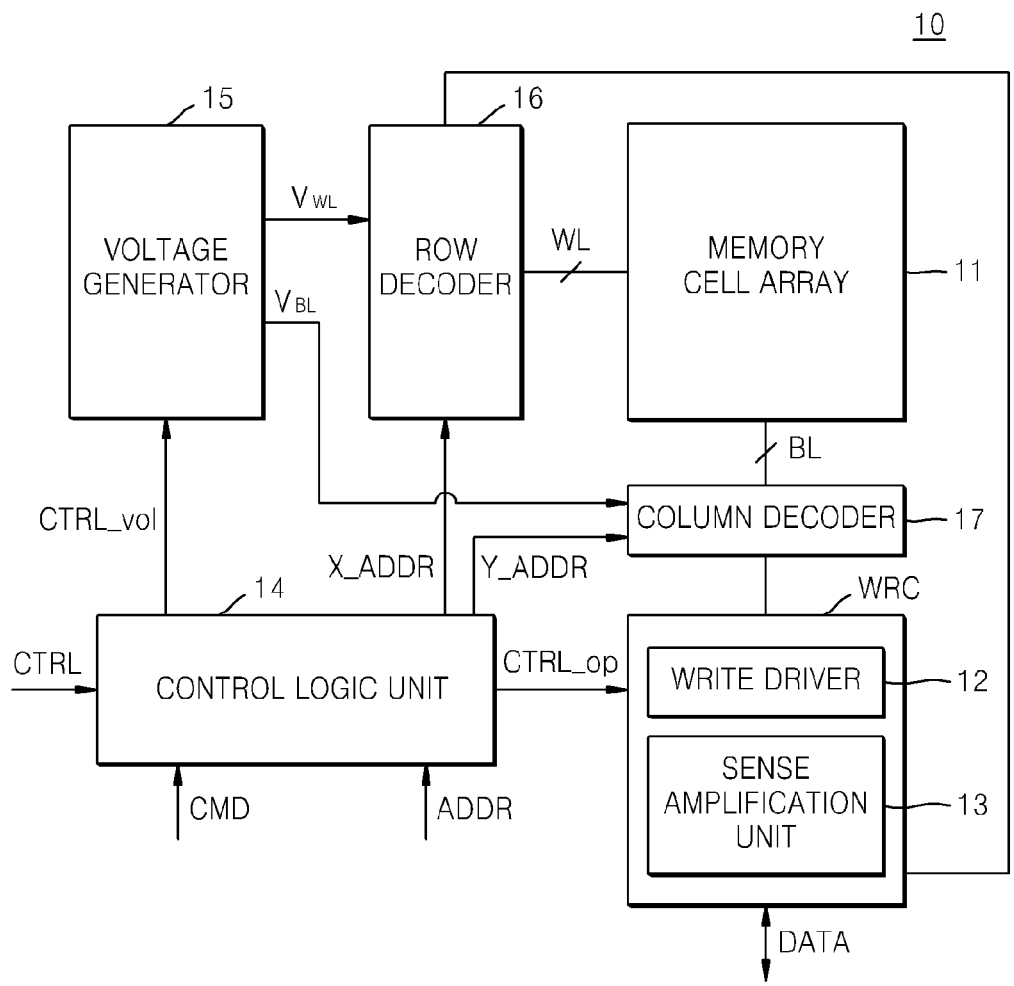
FIG. 2 is a block diagram further illustrating the memory device of FIG. 1.

FIG. 2 is a block diagram further illustrating in one example the memory device 10 of FIG. 1.

Referring to FIG. 2, the memory device 10 comprises a sense amplification unit 13, a control logic unit 14, a voltage generator 15, a row decoder 16 and a column decoder 17 —in addition to the memory cell array 11 and write driver 12 described with reference to FIG. 1. The write driver 12 and sense amplification unit 13 may be combined to constitute a write/read circuit (WRC).

The memory cell array 11 includes an arrangement of first signal lines and second signal lines, where respective memory cells are disposed at intersections of the first and second signal lines. Hereinafter, the described embodiments assume that the first signal lines are bit lines BL and the second signal lines are word lines WL.

At any given time during execution of read/write operations, for example, the write driver 12 may be selectively connected with one bit line BL or one word line WL in order to supply a write current to a selected memory cell located at an intersection of the bit line BL or word line WL. As such, the write driver 12 may assist in the programming of write data to the memory cell array 11, by being selectively connected to one signal line having a relatively low voltage level that is connected to the selected memory cell.

Thus, the write driver 12 may be used to supply a write current (or program current) to a selected bit line BL or selected word line WL during a write operation (or program operation). In certain embodiments of the inventive concept, the write driver 12 may be used to generate a "set write current" in response to a set pulse used to write data having a "0" logic level in a selected memory cell and may generate a "reset write current" in response to a set pulse used to write data having a "0" logic level in a selected memory cell. Alternatively, the write driver 12 may be used to generate a set write current in response to a set pulse used to write a data having a "1" logic level in a selected memory cell and may generate a reset write current in response to a set pulse used to write data having a "1" logic level in a selected memory cell.

The sense amplification unit 13 may be selectively connected to the bit lines BL or the word lines WL in order to amplify a voltage level indicating a data value stored in a selected memory cell to output the amplified data during a read operation. That is, the data stored in a selected memory cell may be read using the sense amplification unit 13. Specifically, the sense amplification unit 13 may be selectively connected to one signal line having a relatively low voltage level (e.g., the selected bit line BL or the selected word line WL) connected to the selected memory cell. Thus in certain embodiments, a read voltage signal Vread may be applied to the selected bit line BL and the sense amplification unit 13 may be connected to the selected word line WL during a read operation. Alternatively, the read voltage signal Vread may be applied to the selected word line WL and the sense amplification unit 13 may be connected to the selected bit line BL during the read operation.

The control logic unit 14 receives the address signal ADDR, the command signal CMD and the control signal CTRL from the memory controller 20 and generates corresponding control signals used to write data to or read data from the memory cell array 11. In this manner, the control logic unit 14 controls the overall operation of the memory device 10.

The control signals provided by the control logic unit 14 may be applied to the write/read circuit WRC, the voltage generator 15, the row decoder 16 and the column decoder 17, for example. Specifically, the control logic unit 14 may apply an operation selection signal CTRL_op to the write/read circuit WRC and a voltage control signal CTRL_vol to the voltage generator 15. In addition, the control logic unit 14 may apply a row address signal X_ADDR to the row decoder 16 and a column address signal Y_ADDR to the column decoder 17.

The voltage generator 15 receives the voltage control signal CTRL_vol and generates various voltage signals used during the execution of program, read, and/or erase operation(s). Specifically, the voltage generator 15 may generate a second drive voltage signal $V_{BL}$ for driving the bit lines BL and a first drive voltage signal $V_{WL}$ for driving the word lines WL.

The first drive voltage signal $V_{WL}$ may be a set write voltage signal Vset, a pass voltage signal Vpass, a first inhibition voltage signal Vinh1 or a read voltage signal Vread. In addition, the second drive voltage signal $V_{BL}$ may be a reset write voltage signal Vreset, a pass voltage signal Vpass, a second inhibition voltage signal Vinh2 or a program verification voltage signal Vver.

The row decoder 16 is connected to the memory cell array 11 via the word lines WL and will selectively activate one of the word lines WL in response to a particular row address signal X_ADDR received from the control logic unit 14. Specifically, the row decoder 16 may receive the row address signal X_ADDR to control a voltage level of the activated word line WL (i.e., a selected word line WL) among a plurality of word lines WL and to control the electrical connection of the plurality of word lines WL.

More specifically, during a read operation, the row decoder 16 may electrically connect the selected word line WL to the sense amplification unit 13 and apply the pass voltage signal Vpass to non-selected word lines WL. Moreover, during a set write operation, the row decoder 16 may electrically connect the write driver 12 to the selected word line WL and apply the second inhibition voltage signal Vinh2 to the non-selected word lines WL. Furthermore, during a reset write operation, the row decoder 16 may apply the reset write voltage signal Vreset to the selected word line WL and apply the second inhibition voltage signal Vinh2 to the non-selected word lines WL.

The column decoder 17 is connected to the memory cell array 11 via bit lines BL and selectively activates at least one of the plurality of bit lines BL in response to the column address signal Y_ADDR received from the control logic unit 14. Specifically, the column decoder 17 may receive the column address signal Y_ADDR to control a voltage level of the activated bit line BL (i.e., a selected bit line BL) among the plurality of bit lines BL and to control the electrical connection of the plurality of bit lines BL.

Figure 3:
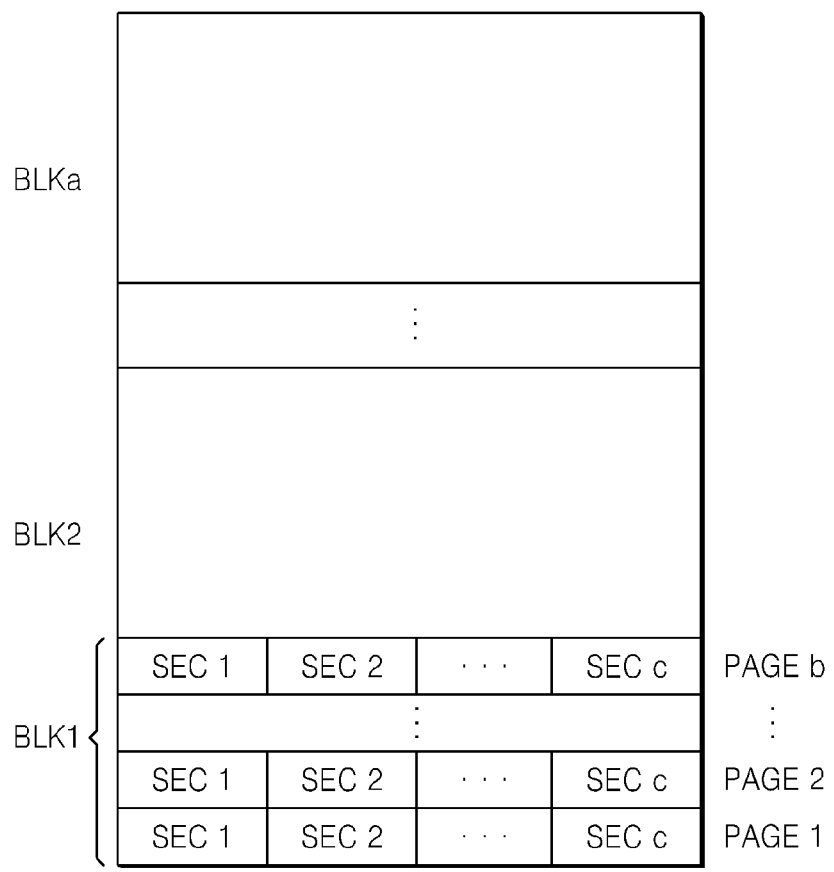
FIG. 3 is a view illustrating an example of a memory cell array that may be included in the memory device of FIG. 2.

FIG. 3 is a block diagram of an exemplary memory cell array that may be included in the memory device 11 of FIG. 2.

Referring to FIG. 3, the memory cell array 11 is assumed to be a resistive memory cell array, and includes a plurality of memory blocks BLK1, ..., and BLKa, where "a" is a positive integer greater than 1. Each memory block BLK1, ..., and BLKa includes a plurality of pages PAGE1, ..., and PAGEb, where "b" is a positive integer greater than 1. In addition, each of the pages PAGE1, . . . , and PAGEb includes a plurality of sectors SEC1, . . . , and SECc, where "c" is a positive integer greater than one.

Figure 4:
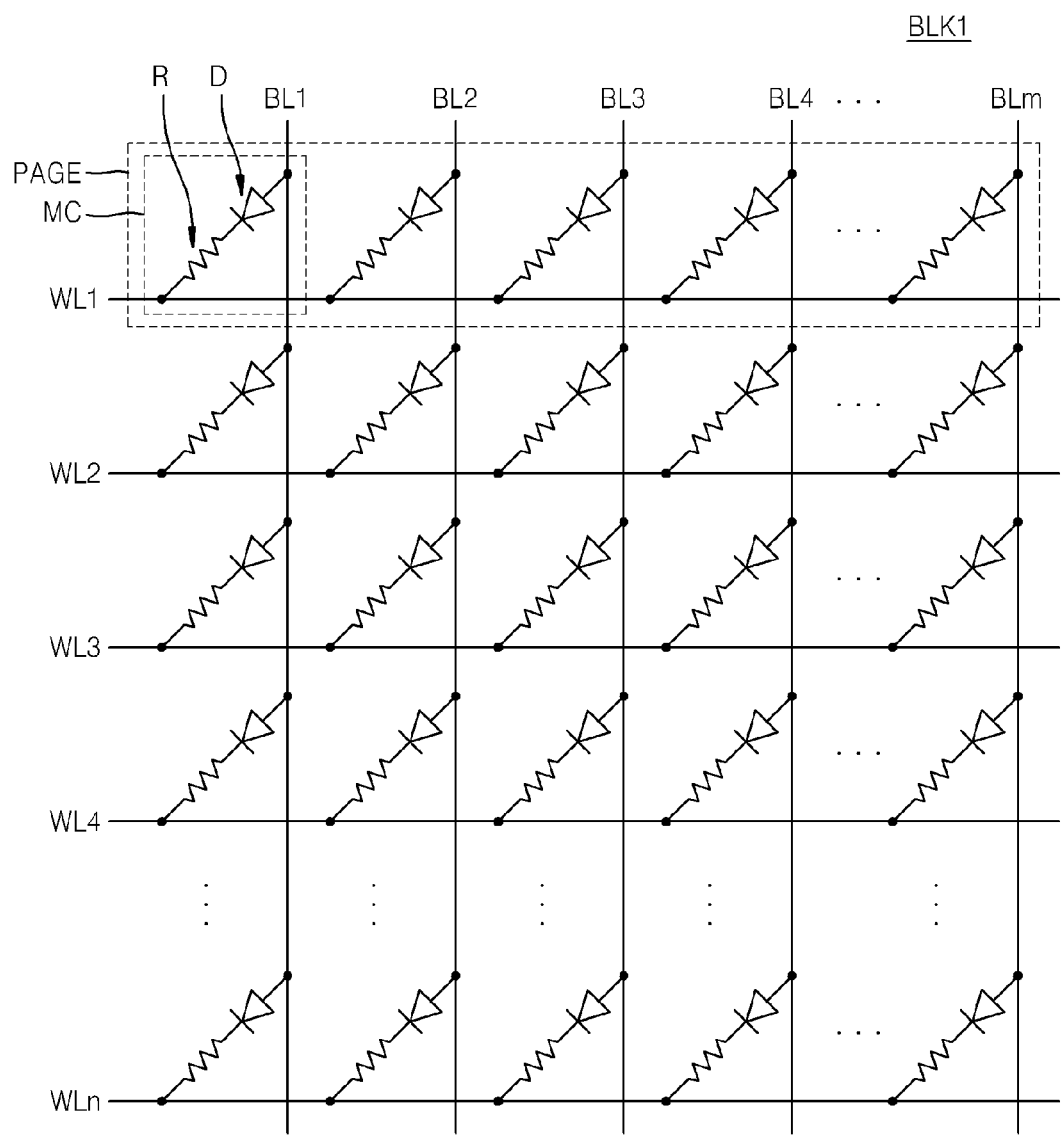
FIG. 4 is an equivalent circuit diagram illustrating an example of a first memory block that may be included in the memory cell array of FIG. 3.

FIG. 4 is an equivalent circuit diagram illustrating an example of a first memory block included in the memory cell array of FIG. 3.

In FIG. 4, the first memory block BLK1 of FIG. 3 is shown in some additional detail as including a plurality of memory cells arranged in a matrix. Each one of the second memory block BLK2 through "a"$^{th}$ memory blocks of FIG. 3 may be similarly arranged.

The first memory block BLK1 include a plurality of word lines WL1, . . . , and WLn, a plurality of bit lines BL1, . . . , and BLm, and a plurality of memory cells MC. The number of the word lines WL1, . . . , and WLn, the number of the bit lines BL1, . . . , and BLm, and the number of the memory cells MC may be set to be different according to the embodiments.

According to the embodiment illustrated in FIG. 4, each of the memory cells MC includes a variable resistor R and a selection element D connected in series. Each of the selection elements D is coupled between one of the bit lines BL1, . . . , and BLm and one of the variable resistors R, and each of the variable resistors R is coupled between one of the word lines WL1, . . . , and WLn and one of the selection elements D. However, the inventive concept is not limited to only this particular configuration. For example, each of the variable resistors R may be coupled between one of the bit lines BL1, . . . , and BLm and one of the selection elements D, and each of the selection elements D may be coupled between one of the word lines WL1, . . . , and WLn and one of the variable resistors R.

With this configuration, each of the variable resistors R may be switched to have any one of a plurality of resistive states in response to an electric pulse signal applied thereto. In some certain embodiments of the inventive concept, each of the variable resistors R may include a phase-change material whose crystalline state varies according to an amount of current applied thereto. For example, the phase-change material may include one of binary materials such as GaSb, InSb, InSe, $Sb_2Te_3$ and GeTe, one of ternary materials such as GeSbTe, GaSeTe, InSbTe, $SnSb_2Te_4$ and InSbGe, or one of quaternary materials such as AgInSbTe, (GeSn)SbTe, GeSb (SeTe) and $Te_{81}Ge_{15}Sb_2S_2$.

Each of the phase-change materials listed above may have an amorphous state exhibiting a relatively high resistance value or a crystalline state exhibiting a relatively low resistance value. The phase of the phase-change materials listed above may be changed by Joule's heat generated in response to an applied amount of electrical current. Thus, desired data may be written in the phase-change materials using the phase changeable characteristic of the phase-change materials.

In some embodiments, each of the variable resistors R may include one of perovskite materials, transition metal oxide materials, magnetic materials and ferroelectric materials instead of the phase-change material.

Each of the selection elements D may be coupled between one of the bit lines BL1~BLm and one of the variable resistors R and may control an amount of current flowing through the variable resistor R according to a voltage difference between the bit line and the word line. In some embodiments, the selection elements D may be PN diodes or PIN diodes. In such a case, anodes of the diodes D may be connected to the bit lines BL1~BLm, and cathodes of the diodes D may be connected to respective ones of the variable resistors R. Accordingly, if a voltage applied between the anode and the cathode of the diode D is higher than a threshold voltage (or a cut-in voltage) of the diode D, the diode D is turned ON to supply a current to the variable resistor R.

Figure 5:
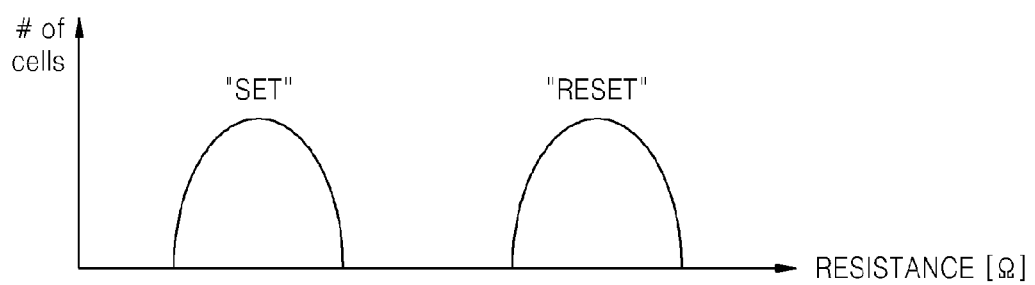
FIG. 5 is a graph showing distribution of memory cells illustrated in FIG. 4 as a function of a resistance value of each memory cell when the memory cells are single level cells.

FIG. 5 is a graph showing exemplary distributions of memory cells illustrated in FIG. 4 as a function of a resistance value for each memory cell when the memory cells are single level cells.

Referring to FIG. 5, the X-axis represents a resistance value of the memory cells MC and the Y-axis represents a number of the memory cells MC. When the memory cells MC are single level cells, each of the memory cells MC may exhibit one of a set state SET having a relatively low resistance value and a reset state RESET having a relatively high resistance value.

The operation of switching a memory cell to the high resistive state will be referred to as a "reset operation" or a "reset write operation". In such a case, a data value of '1' is assumed to be written in the selected memory cell during the reset write operation. In contrast, the operation of switching a memory cell to the low resistive state will be referred to as a "set operation" or a "set write operation". In such a case, a data value of '0' is assumed to be written in the selected memory cell during the set write operation.

Figure 6:
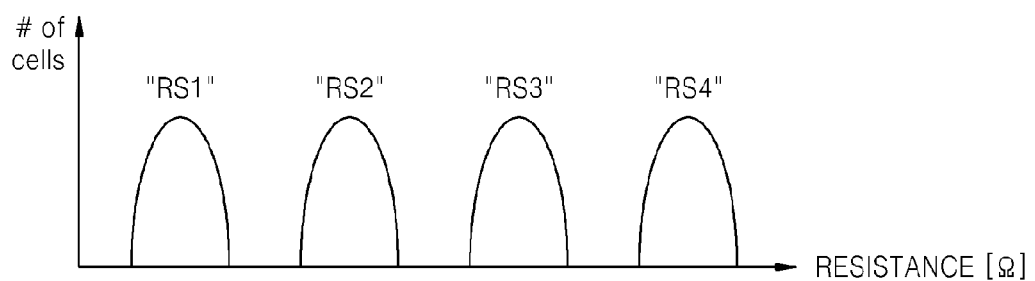
FIG. 6 is a graph showing distribution of memory cells illustrated in FIG. 4 as a function of a resistance value of each memory cell when the memory cells are multi-level cells.

FIG. 6 is a graph showing exemplary distributions of memory cells illustrated in FIG. 4 as a function of a resistance value of each memory cell when the memory cells are multi-level cells (e.g. 2-bit).

Referring to FIG. 6, the X-axis again represents a resistance value of the memory cells MC and the Y-axis represents a number of the memory cells MC. Here, the 2-bit, multi-level cells will have one of four possible resistive states; a first resistive state RS1, a second resistive state RS2, a third resistive state RS3 and a fourth resistive state RS4.

Where multi-level cells are used, gaps between adjacent states among the first, second, third and fourth resistive states RS1, RS2, RS3 and RS4 will be narrower than a gap between the set state SET and the reset state RESET of the single level cells. This reduction in discrimination (or read) margin may lead to increase of read errors for the multi-level cells. Thus, the respective distribution ranges for each of the first to fourth resistive states RS1, RS2, RS3 and RS4 must be narrowed in order to reduce or prevent adjacent states from overlapping.

Each of the first to fourth resistive states RS1, RS2, RS3 and RS4 may respectively correspond with data values of '00', '01', '10' and '11', or '11', '01', '00' and '10'. That is, a resistance value associated with a data value of '01' may be greater than a resistance value associated with a data value of '11', and a resistance value associated with a data value of '00' may be greater than a resistance value associated with a data value of '01'. In addition, a resistance value associated with a data value of '10' may be greater than a resistance value associated with a data value of '00'.

Figure 7:
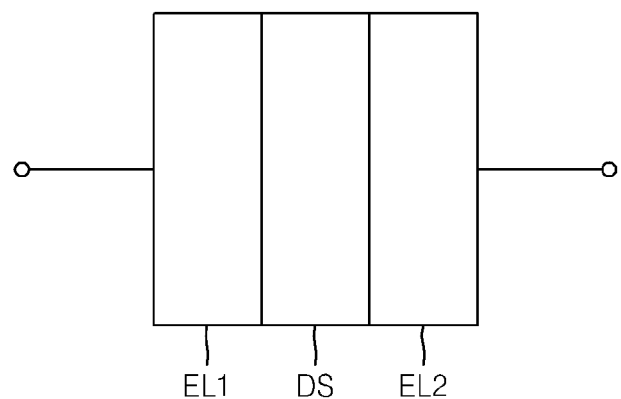
FIG. 7 illustrates one example of a variable resistor that may be included in each of the memory cells shown in FIG. 4.

FIG. 7 illustrates one example of a type of variable resistor that may be used to embody each of the memory cells shown in FIG. 4.

Referring to FIG. 7, the variable resistor R may include a first electrode EL1, a second electrode EL2 and a data storage film DS disposed between the first and second electrodes EL1 and EL2.

The first and second electrodes EL1 and EL2 may be formed to include at least one of various materials such as metal materials, metal oxide materials and metal nitride materials. For example, the first and second electrodes EL1 and EL2 may include aluminum (Al), copper (Cu), titanium nitride (TiN), titanium aluminum nitride ($Ti_xAl_yN_z$), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconium (Zr), zinc (Zn), iridium oxide ($IrO_2$) or strontium zirconium oxide ($SrZrO_3$).

The data storage film DS may include a bipolar resistive storage material or a unipolar resistive storage material. The bipolar resistive storage material may be programmed to have a set state or a reset state according to a polarity of a pulse applied thereto. Perovskite materials may be used as the bipolar resistive storage material. Meanwhile, the unipolar resistive storage material may be programmed to have a set state or a reset state even by pulses having the same polarity. Transition metal oxide materials such as a nickel oxide ($NiO_x$) material and a titanium oxide ($TiO_x$) material may be used as the unipolar resistive storage material.

FIGS. 8, 9, 10 and 11 are respective equivalent circuit diagrams illustrating various types of memory cells that may be used in FIG. 4.

Figure 8:
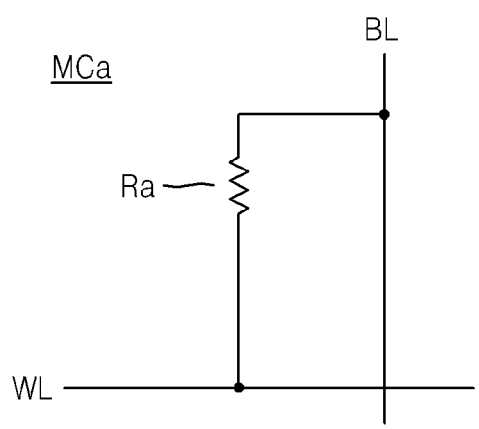
FIGS. 8, 9, 10 and 11 are respective equivalent circuit diagrams for various modified embodiments of each of the memory cells shown in FIG. 4.

Referring to FIG. 8, a memory cell MCa may include a variable resistor Ra, and the variable resistor Ra may be coupled between the bit line BL and the word line WL. The memory cell MCa may be programmed by voltage signals applied to the bit line BL and the word line WL.

Figure 9:
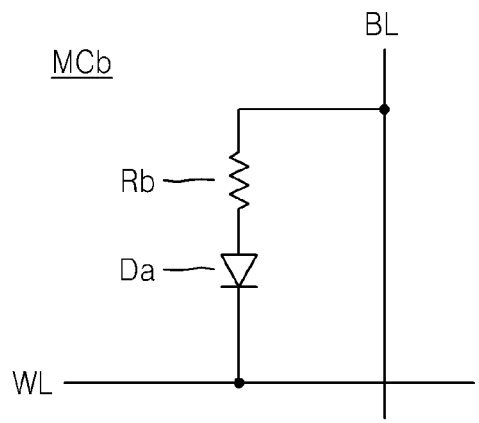

Referring to FIG. 9, a memory cell MCb may include a variable resistor Rb and a diode Da which are connected in series. The variable resistor Rb may include a resistive material for storing a piece of data. The diode Da may function as a selection element, that is, a switching element that supplies or blocks a current to the variable resistor Rb according to a bias condition between the word line WL and the bit line BL. The diode Da may be coupled between the variable resistor Rb and the word line WL, and the variable resistor Rb may be coupled between the diode Da and the bit line BL. In some embodiments, the diode Da and the variable resistor Rb may be exchanged. That is, the diode Da may be connected to the bit line BL and the variable resistor Rb may be connected to the word line WL.

Figure 10:
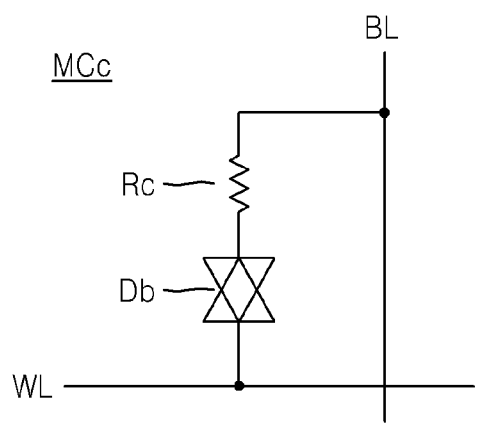

Referring to FIG. 10, a memory cell MCc may include a variable resistor Rc and a bidirectional diode Db which are connected in series. The variable resistor Rc may include a resistive material for storing a piece of data. The bidirectional diode Db may be coupled between the variable resistor Rc and the word line WL, and the variable resistor Rc may be coupled between the bidirectional diode Db and the bit line BL. In some embodiments, the bidirectional diode Db and the variable resistor Rc may be exchanged. That is, the bidirectional diode Db may be connected to the bit line BL and the variable resistor Rc may be connected to the word line WL. The bidirectional diode Db may prevent a leakage current from flowing through the memory cell MCc when the memory cell MCc is non-selected.

Figure 11:
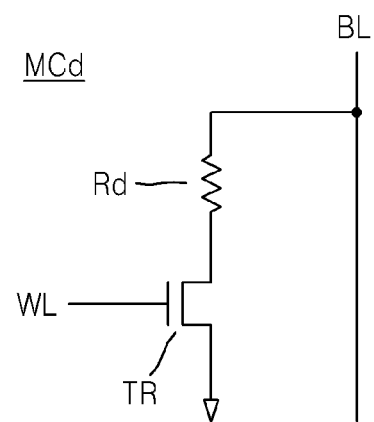

Referring to FIG. 11, a memory cell MCd may include a variable resistor Rd and a transistor TR which are connected in series. The transistor TR may function as a selection element, that is, a switching element that supplies or blocks a current to the variable resistor Rd in response to a voltage level applied to the word line WL. The transistor TR may be coupled between the variable resistor Rd and a ground line, and a gate of the transistor TR may be connected to the word line WL. The variable resistor Rd may be coupled between the transistor TR and the bit line BL. In some embodiments, the transistor TR and the variable resistor Rd may be exchanged. That is, the transistor TR may be connected to the bit line BL and the variable resistor Rd may be connected to the ground line. The memory cell MCd may be selected or non-selected according to whether the transistor TR is turned ON/OFF.

Figure 12:
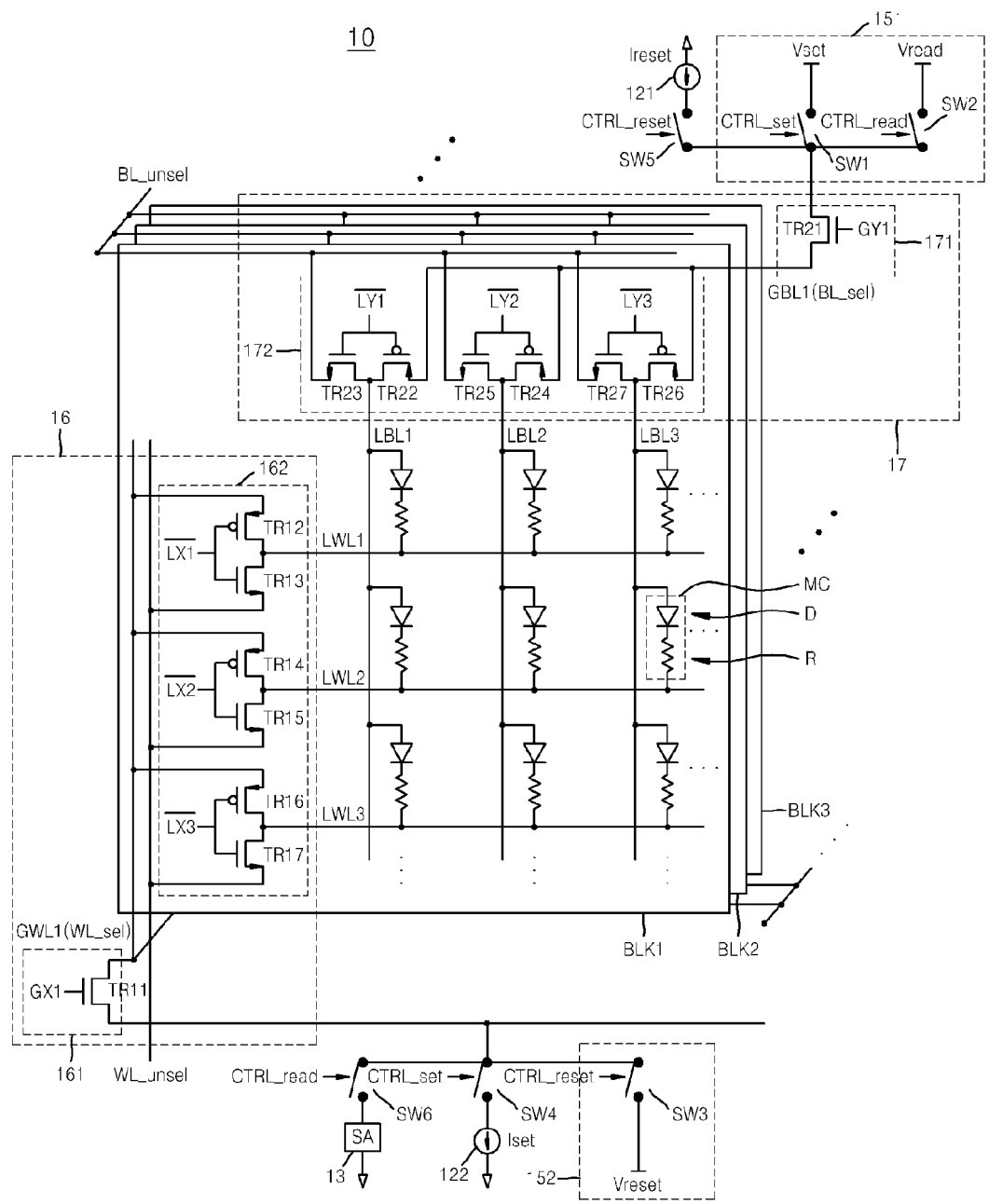
FIG. 12 is a circuit diagram illustrating the memory device shown in FIG. 2.

FIG. 12 is a circuit diagram further illustrating in one example the memory device 10 of FIG. 2.

Referring to FIG. 12, the memory device 10 includes a plurality of memory blocks BLK1, BLK2 and BLK3 disposed in the memory cell array 11, as described with reference to FIG. 3. The plurality of memory blocks BLK1, BLK2 and BLK3 may have the same configuration. Thus, for the purpose of ease and convenience in explanation, only the first memory block BLK1 will be described hereinafter. Each of the plurality of memory blocks BLK1, BLK2 and BLK3 may also be referred to as a memory plane.

The row decoder 16 may include a first row decoder 161 and a second row decoder 162. The first row decoder 161 may activate a first global word line GWL1 in response to a first global row address signal GX1. The first row decoder 161 may be configured to include a transistor TR11 and may be referred to as a global row switch. For example, if the first global row address signal GX1 has a logic "high" level, the transistor TR11 is turned ON such that the first row decoder 161 electrically connects the first global word line GWL1 to the sense amplification unit 13, a second write driver 122 or a second voltage generator 152.

The second row decoder 162 may selectively activate first to third local word lines LWL1, LWL2 and LWL3 in response to complementary signals of first to third local row address signals LX1, LX2 and LX3. The first to third local word lines LWL1, LWL2 and LWL3 may correspond to the word lines WL illustrated in FIG. 2. The second row decoder 162 may be configured to include transistors TR12~TR17 and may also be referred to as a local row switch. For example, if the complementary signal of the first local row address signal LX1 has a logic "low" level, the transistor TR12 (e.g., a PMOS transistor) is turned ON and the transistor TR13 (e.g., an NMOS transistor) is turned OFF. In such a case, the first local word line LWL1 may be electrically connected to the first global word line GWL1.

The column decoder 17 may include a first column decoder 171 and a second column decoder 172. The first column decoder 171 may activate a first global bit line GBL1 in response to a first global column address signal GY1. The first column decoder 171 may be configured to include a transistor TR21 and may be referred to as a global column switch. For example, if the first global column address signal GY1 has a logic "high" level, the transistor TR21 is turned ON such that the first column decoder 171 electrically connects the first global bit line GBL1 to a first write driver 121 or a first voltage generator 151.

The second column decoder 172 may selectively activate first to third local bit lines LBL1, LBL2 and LBL3 in response to complementary signals of first to third local column address signals LY1, LY2 and LY3. The first to third local bit lines LBL1, LBL2 and LBL3 may correspond to the bit lines BL illustrated in FIG. 2. The second column decoder 172 may be configured to include transistors TR22~TR27 and may also be referred to as a local column switch. For example, if the complementary signal of the first local column address signal LY1 has a logic "low" level, the transistor TR22 (e.g., a PMOS transistor) is turned ON and the transistor TR23 (e.g., an NMOS transistor) is turned OFF. In such a case, the first local bit line LBL1 may be electrically connected to the first global bit line GBL1.

The write driver 12 of FIG. 2 may include the first and second write drivers 121 and 122. The first write driver 121 may be electrically connected to the first global bit line GBL1 according to a reset selection signal CTRL_reset received from the control logic unit (14 of FIG. 2). The second write driver 122 may be electrically connected to the first global word line GWL1 according to a set selection signal CTRL_set received from the control logic unit 14. However, the inventive concept is not limited to the above descriptions. In some embodiments, the write driver 12 may be realized as a single driver and may be electrically connected to the first global bit line GBL1 or the first global word line GWL1 according to the reset selection signal CTRL_reset or the set selection signal CTRL_set.

As described above, according to the embodiment illustrated in FIG. 12, the second write driver 122 may be electrically connected to any one of the first to third local word lines LWL1, LWL2 and LWL3 corresponding to the word lines WL of FIG. 2 during the set write operation and the first write driver 121 may be electrically connected to any one of the first to third local bit lines LBL1, LBL2 and LBL3 corresponding to the bit lines BL of FIG. 2 during the reset write operation.

The voltage generator 15 of FIG. 2 includes first and second voltage generators 151 and 152. The first voltage generator 151 may be used provide a set write voltage Vset according to the set selection signal CTRL_set received from the control logic unit 14, or to provide a read voltage Vread according to a read selection signal CTRL_read received from the control logic unit 14. The second voltage generator 152 may be used to provide a reset write voltage Vreset according to the reset selection signal CTRL_reset received from the control logic unit 14.

The sense amplification unit 13 may be electrically connected to the first global word line GWL1 according to the read selection signal CTRL_read received from the control logic unit 14, but the inventive concept is not limited to only this approach. For example, in some embodiments, the sense amplification unit 13 may be electrically connected to the first global bit line GBL1 according to the read selection signal CTRL_read received from the control logic unit 14.

Figure 13:
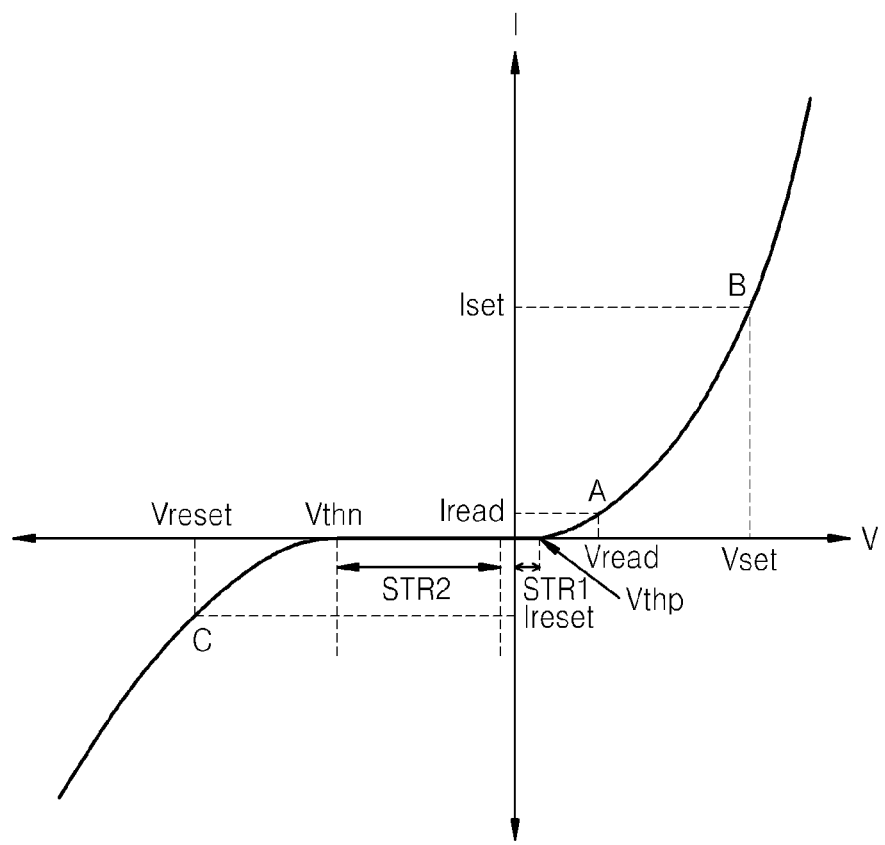
FIG. 13 is a graph illustrating an I-V characteristic of a selection element included in each of memory cells of FIG. 12.

FIG. 13 is a graph illustrating an current (I)-voltage (V) characteristics of a selection element D that may be included in the memory cells MC of FIG. 12.

Referring to FIG. 13, the X-axis represents a voltage V and the ordinate represents a current I. In the graph of FIG. 13, the point 'A' denotes a bias condition for a read operation. That is, the read voltage Vread necessary for the read operation may have a relatively small positive value and a read current Iread may also have a relatively small value. The point 'B' denotes a bias condition for a set write operation. That is, the set write voltage Vset necessary for the set write operation may have a positive value greater than the read voltage Vread and a set write current Iset may have a positive value greater than the read current Iread. Moreover, the point 'C' denotes a bias condition for a reset write operation. That is, the reset write voltage Vreset necessary for the reset write operation may have a negative value with a relatively large absolute value and a reset write current Ireset may have a negative value.

Thus, the I-V characteristics shown in FIG. 13 for the selection element D may be said to be "non-symmetric" with respect to the Y-axis. For example, the I-V characteristic of the selection element D may have a first threshold voltage Vthp on a positive X-axis and may have a second threshold voltage Vthn, an absolute value of which is greater than the first threshold voltage Vthp, on a negative X-axis.

If a voltage, less than an absolute value of the first or second threshold voltage Vthp or Vthn, is applied to the selection element D, the selection element D is turned OFF to allow only a leakage current to flow through the selection element D. Meanwhile, if a voltage, which is greater than an absolute value of the first or second threshold voltage Vthp or Vthn, is applied to the selection element D, the selection element D is turned ON to allow the read current Iread, the set write current Iset or the reset write current Ireset to flow through the variable resistor R.

A region having a voltage less than the first threshold voltage Vthp may be referred to as a first sub-threshold region STR1, and a region having a voltage less than an absolute value of the second threshold voltage Vthn may be referred to as a second sub-threshold region STR2. If a voltage difference between non-selected bit lines BL_unsel and a selected word line WL_sel is within the range of the sub-threshold region STR1 (or STR2) or a voltage difference between a selected bit line BL_sel and non-selected word lines WL_unsel is within the range of the sub-threshold region STR1 (or STR2), the selection element D is turned OFF to allow only the leakage current to flow through half-selected memory cells (or semi-selected memory cells) during the read operation or the write operation. Thus, cell current flowing through the half-selected memory cells may be significantly reduced during read and/or write operation(s).

In the embodiment illustrated in FIG. 13, the I-V characteristic of the selection element D may be non-symmetric with respect to the Y-axis, as described above. That is, a range of the first sub-threshold region STR1 may be narrower than a range of the second sub-threshold region STR2. Thus, the operating margin in the second sub-threshold region STR2 will be greater than the operating margin in the first sub-threshold region STR1. Accordingly, if a voltage difference between the non-selected bit lines BL_unsel and the selected word line WL_sel is within the range of the second sub-threshold region STR2 or a voltage difference between the selected bit line BL_sel and the non-selected word lines WL_unsel is within the range of the second sub-threshold region STR2, the cell current flowing through the half-selected memory cells may be more significantly reduced during the read operation or the write operation.

Figure 14:
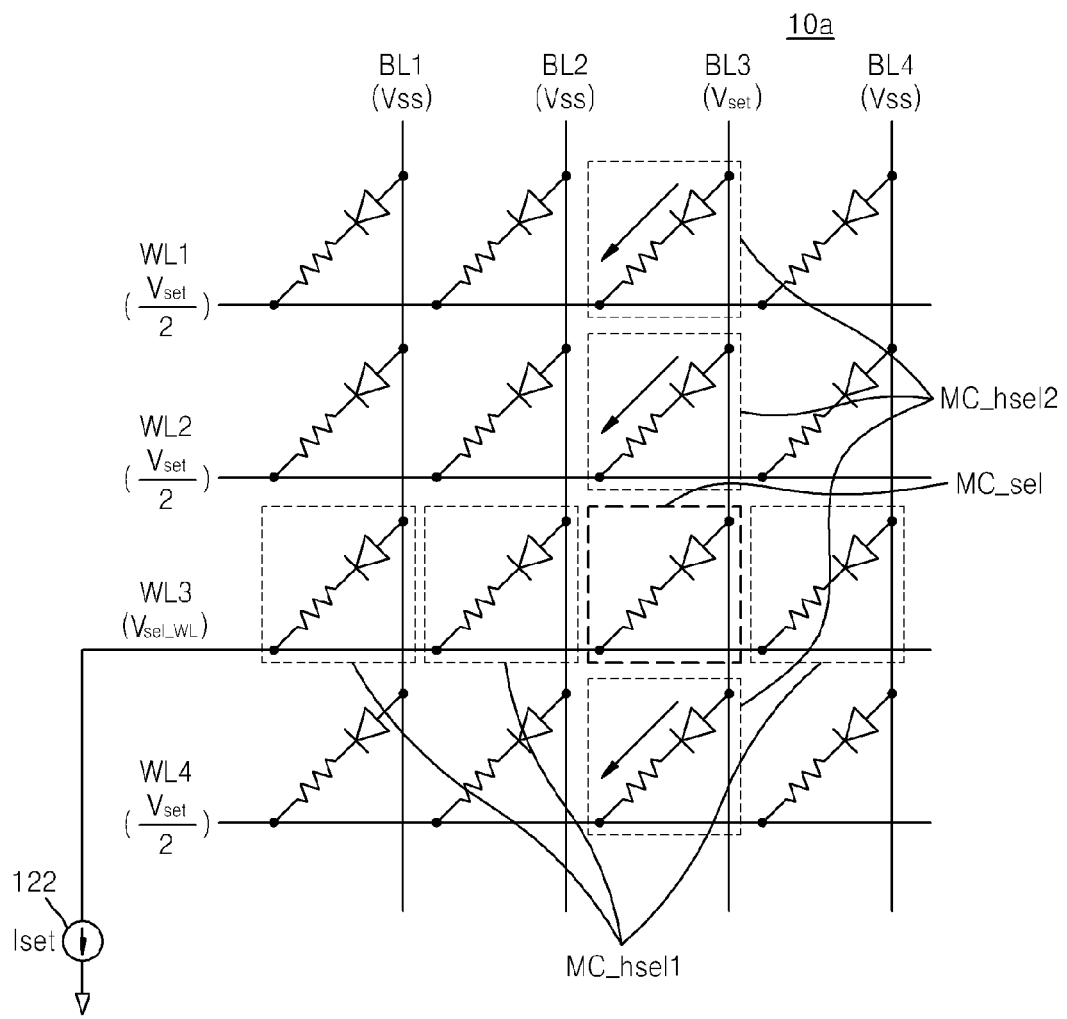
FIG. 14 illustrates an equivalent circuit diagram of a portion of a memory cell array of the memory device shown in FIG. 2 with a bias condition applied during a set write operation according to an embodiment of the inventive concept.

FIG. 14 is an equivalent circuit diagram for a first selected portion 10a of the memory cell array 11 of the memory device 10 shown in FIG. 2 assuming a bias condition applied during a set write operation according to an embodiment of the inventive concept.

Referring to FIG. 14, first, second and fourth bit lines BL1, BL2 and BL4 are non-selected bit lines BL_unsel and a third bit line BL3 is a selected bit line BL_sel. In addition, first, second and fourth word lines WL1, WL2 and WL4 are non-selected word lines WL_unsel and a third word line WL3 is a selected word line WL_sel.

In such a case, the memory cell connected to the selected bit line BL_sel (i.e., the third bit line BL3) and the selected word line WL_sel (i.e., the third word line WL3) is the selected memory cell MC_sel, and the memory cells coupled between the non-selected bit lines BL_unsel and the non-selected word lines WL_unsel are non-selected memory cells. Furthermore, the memory cells coupled between the non-selected bit lines BL_unsel and the selected word line WL_sel are first half-selected memory cells MC_hsel1, and the memory cells coupled between the non-selected word lines WL_unsel and the selected bit line BL_sel are second half-selected memory cells MC_hsel2.

In the embodiment illustrated in FIG. 14, the set write voltage Vset is applied to the selected bit line BL_sel and a first inhibition voltage Vinh1 is applied to the non-selected bit lines BL_unsel. In addition, a first voltage $Vsel\_{WL}$ is applied to the selected word line WL_sel and a second inhibition voltage Vinh2 is applied to the non-selected word lines WL_unsel.

Hence, a voltage difference between the first inhibition voltage Vinh1 and the first voltage $Vsel\_{WL}$ will be less than a threshold voltage of the selection element D. For example, the voltage difference between the first inhibition voltage Vinh1 and the first voltage $Vsel\_{WL}$ will fall within the second sub-threshold region STR2 of the selection element D illustrated in FIG. 13. In such a case, the first voltage $Vsel\_{WL}$ will vary according to the set write current Iset generated from the write driver 12 or a configuration of the write driver 12.

Figure 15:
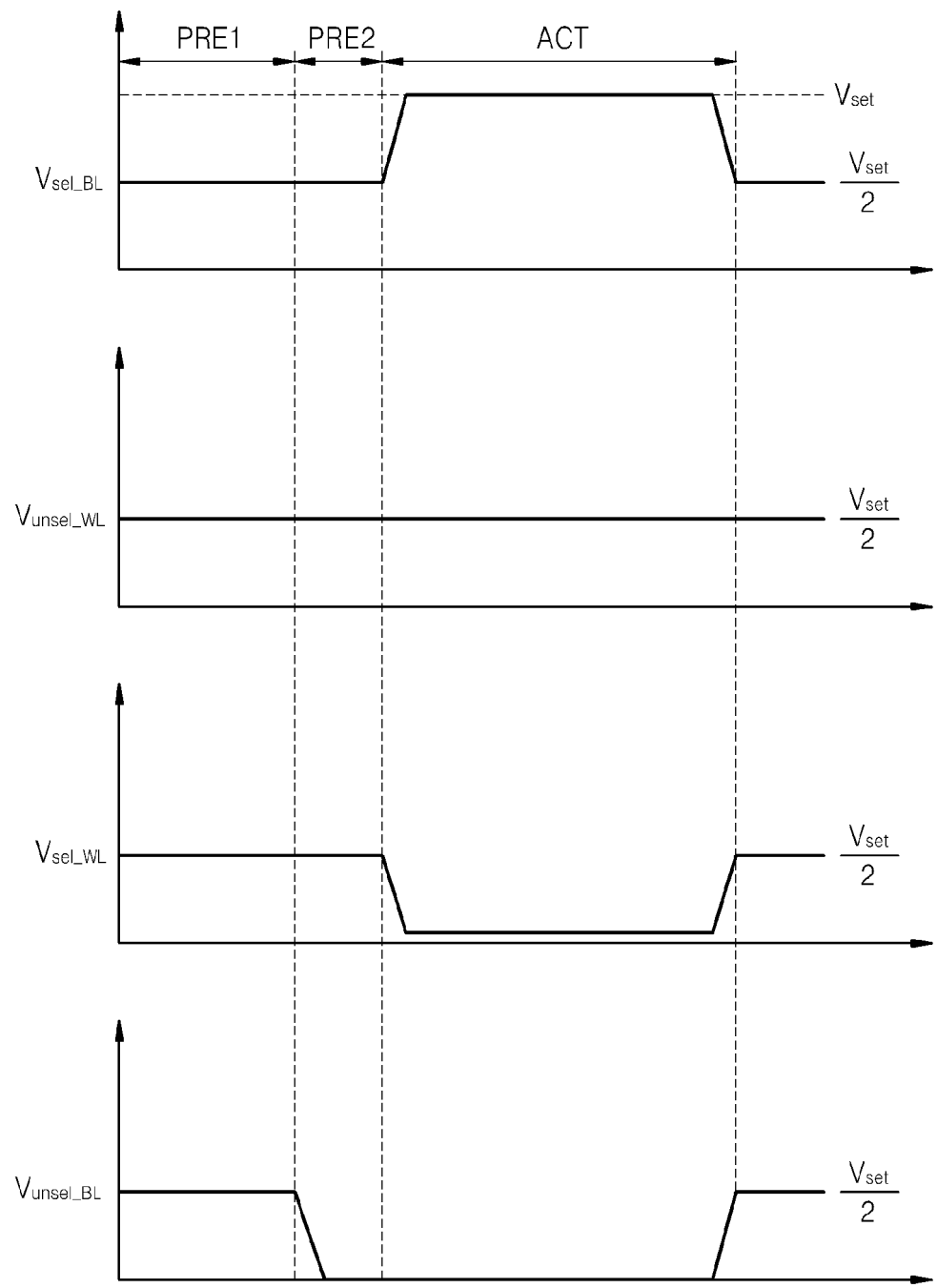
FIG. 15 illustrates waveforms of voltage signals applied to word lines and bit lines shown in FIG. 14.

FIG. 15 is a set of waveform diagrams for voltage signals applied to the word lines and the bit lines shown in FIG. 14.

Referring to FIG. 15, the X-axis represents a time and the Y-axis represents a voltage level. In a first pre-charge mode PRE1, the selected bit line BL_sel, the non-selected word lines WL_unsel, the selected word line WL_sel and the non-selected bit lines BL_unsel are pre-charged to a pre-charge voltage (e.g., one-half of the set write voltage Vset or Vset/2). In a second pre-charge mode PRE2, only the voltage level $Vunsel\_{BL}$ of the non-selected bit lines BL_unsel are pulled down to ground voltage Vss, and voltage levels $Vsel\_{BL}$, $Vunsel\_{WL}$ and $Vsel\_{WL}$ of the selected bit line BL_sel, while the non-selected word lines WL_unsel and the selected word line WL_sel are maintained at the pre-charge voltage (i.e., Vset/2).

In an active mode ACT, the voltage level $Vsel\_{BL}$ of the selected bit line BL_sel changes to the set voltage Vset, the non-selected word lines WL_unsel are maintained at the pre-charge voltage (i.e., Vset/2), the voltage level $Vsel\_{WL}$ of the selected word line WL_sel changes to a voltage near ground voltage Vss, and the non-selected bit lines BL_unsel is maintained at ground voltage Vss.

Hereinafter, the set write operation according to certain embodiments of the inventive concept will be described with reference to FIGS. 14 and 15.

The set write voltage Vset is applied to the selected bit line BL_sel, and the selected word line WL_sel is connected to the second write driver 122 generating the set write current Iset. As a result, the set write current Iset flows through the selected word line WL_sel, the selected memory cell MC_sel and the selected bit line BL_sel. In such a case, the first voltage $Vsel\_{WL}$ near ground voltage Vss is induced at the selected word line WL_sel, and a first data value (e.g., a logic '1') is stored in the selected memory cell MC_sel by the set write current Iset generated from the second write driver 122.

During the set write operation, a voltage level of the selected bit line BL_sel will be higher than a voltage level of the selected word line WL_sel. Thus, the write driver 12, that is, the second write driver 122 may be connected to the selected word line WL_sel. As described above, the second write driver 122 is not connected to a high voltage line of the selected bit line BL_sel and the selected word line WL_sel, but instead is connected to a low voltage line of the selected bit line BL_sel and the selected word line WL_sel during the set write operation. That is, the set write current Iset generated from the second write driver 122 is not forced into the selected bit line BL_sel but drained from the selected word line WL_sel. Thus, most of the set write current Iset generated from the second write driver 122 connected to the low voltage line (i.e., the selected word line WL_sel) will flow through the selected memory cell MC_sel to minimize the leakage currents flowing through the non-selected memory cells, the first half-selected memory cells MC_hsel1, and the second half-selected memory cells MC_hsel2.

Moreover, the first inhibition voltage Vinh1, for example, ground voltage Vss is applied to the non-selected bit lines BL_unsel, and the first voltage $Vsel\_{WL}$ near ground voltage Vss is induced at the selected word line WL_sel. In such a case, a voltage difference between the first inhibition voltage Vinh1 and the first voltage $Vsel\_{WL}$ will be less than the threshold voltage of the selection elements D. In some embodiments, the voltage deference between the first inhibition voltage Vinh1 and the first voltage $Vsel\_{WL}$ will fall within the second sub-threshold region STR2 of the selection elements D.

For example, the first inhibition voltage Vinh1 may be ground voltage Vss, the first voltage $Vsel\_{WL}$ may be near ground voltage Vss, and the first voltage $Vsel\_{WL}$ may be higher than the first inhibition voltage Vinh1. Thus, the voltage difference between the first inhibition voltage Vinh1 and the first voltage $Vsel\_{WL}$ may fall within the second sub-threshold region STR2 of the selection elements D. As a result, the selection elements D included associated with the first half-selected memory cells MC_hsell coupled between the non-selected bit lines BL_unsel and the selected word line WL_sel are turned OFF to minimize the leakage currents flowing through the first half-selected memory cells MC_hsel1.

Furthermore, assuming that the second inhibition voltage Vinh2 (e.g., Vset/2) is applied to the non-selected word line WL_unsel and the set write voltage Vset is be applied to the selected bit line BL_sel. a voltage difference between the second inhibition voltage Vinh2 and the set write voltage Vset will be Vset/2. In such a case, leakage currents may flow through the second half-selected memory cells MC_hsel2.

However, according to the present embodiment, the second write driver 122 will be connected to a low voltage line of the selected word line WL_sel and the selected bit line BL_sel during the set write operation. Thus, most of the set write current Iset supplied from the second write driver 122 will flow through the selected memory cells MC_sel to remarkably reduce the leakage currents flowing through the second half-selected memory cells MC_hsel2 coupled between the non-selected word line WL_unsel and the selected bit line BL_sel.

Figure 16:
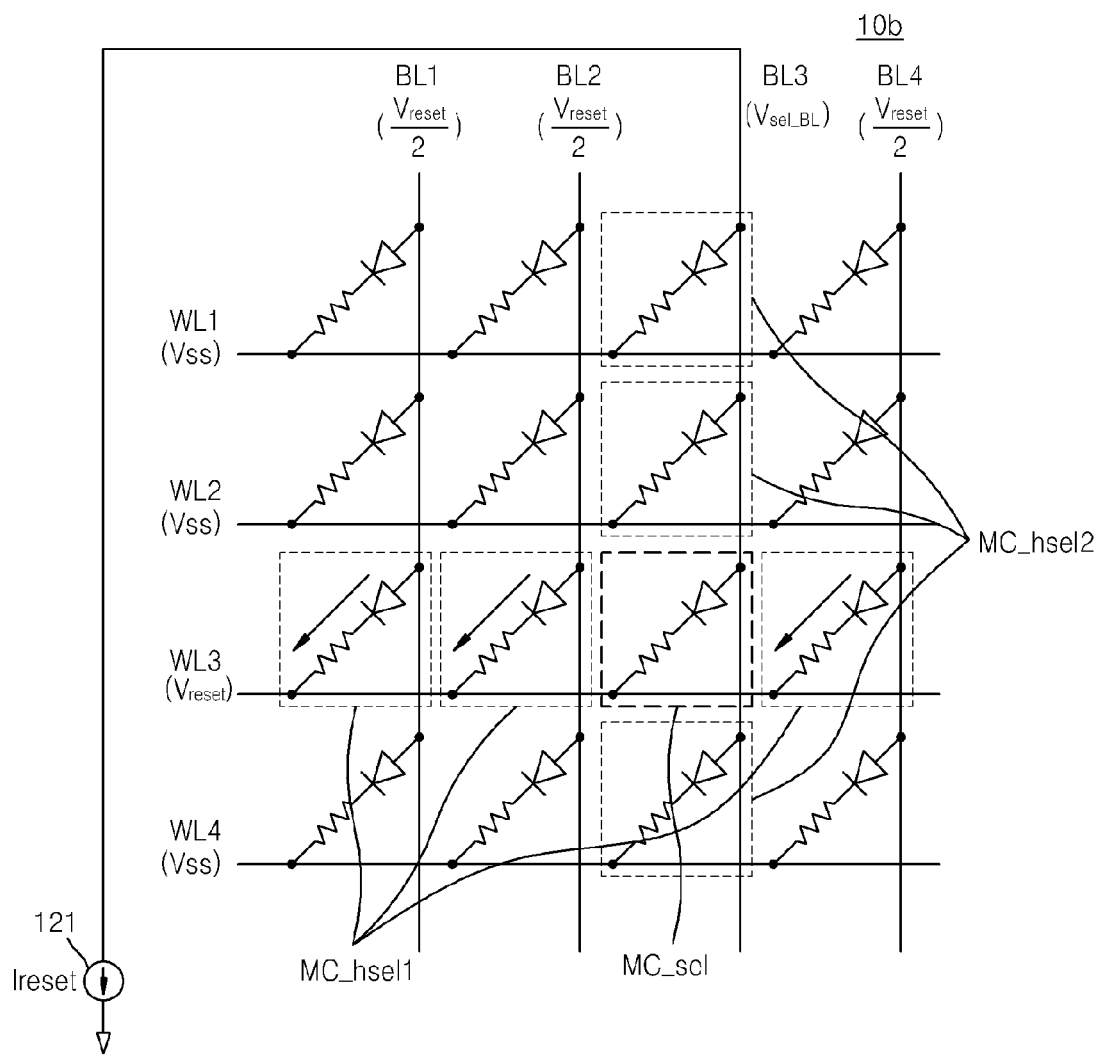
FIG. 16 illustrates an equivalent circuit diagram of a portion of a memory cell array of the memory device shown in FIG. 2 with a bias condition applied during a reset write operation according to an embodiment of the inventive concept.

FIG. 16 is another equivalent circuit diagram for a second selected portion 10b of the memory cell array 11 of the memory device 10 shown in FIG. 2 assuming a bias condition applied during a reset write operation according to an embodiment of the inventive concept.

Referring to FIG. 16, the first, second and fourth bit lines BL1, BL2 and BL4 are non-selected bit lines BL_unsel and the third bit line BL3 is a selected bit line BL_sel. In addition, the first, second and fourth word lines WL1, WL2 and WL4 are non-selected word lines WL_unsel and the third word line WL3 is a selected word line WL_sel.

In such a case, the memory cell connected to the selected bit line BL_sel (i.e., the third bit line BL3) and the selected word line WL_sel (i.e., the third word line WL3) will be the selected memory cell MC_sel. Moreover, memory cells coupled between the non-selected bit lines BL_unsel and the non-selected word lines WL_unsel will be non-selected memory cells. Furthermore, memory cells coupled between the non-selected bit lines BL_unsel and the selected word line WL_sel are first half-selected memory cells MC_hsel1, and memory cells coupled between the non-selected word lines WL_unsel and the selected bit line BL_sel are second half-selected memory cells MC_hsel2.

In the embodiment illustrated in FIG. 16, a second voltage $Vsel\_{BL}$ is applied to the selected bit line BL_sel, a third inhibition voltage Vinh3 is applied to the non-selected bit lines BL_unsel, the reset write voltage Vreset is applied to the selected word line WL_sel, and a fourth inhibition voltage Vinh4 is applied to the non-selected word lines WL_unsel.

As such, a voltage difference between the fourth inhibition voltage Vinh4 and the second voltage $Vsel\_{BL}$ will be less than the threshold voltage of the selection element D. For example, the voltage difference between the fourth inhibition voltage Vinh4 and the second voltage $Vsel\_{BL}$ may fall within the second sub-threshold region STR2 of the selection element D illustrated in FIG. 13. In such a case, the second voltage $Vsel\_{BL}$ will vary according to the reset write current Ireset generated from the write driver 12 or a configuration of the write driver 12.

Figure 17:
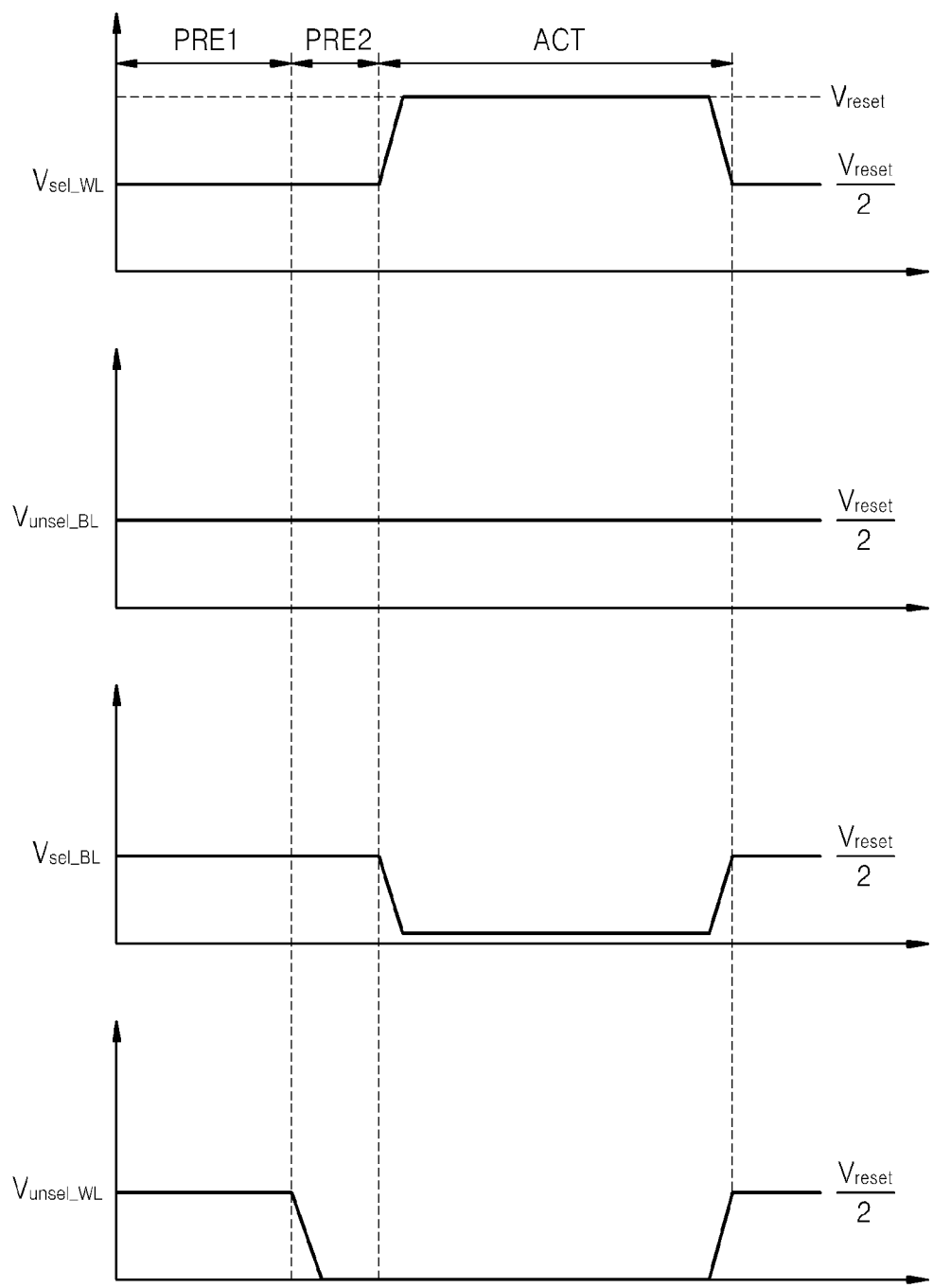
FIG. 17 illustrates waveforms of voltage signals applied to word lines and bit lines shown in FIG. 16.

FIG. 17 is a set of waveform diagrams for voltage signals applied to the word lines and the bit lines shown in FIG. 16.

Referring to FIG. 17, the X-axis represents a time and the Y-axis represents a voltage level. In a first pre-charge mode PRE1, the selected bit line BL_sel, the non-selected word lines WL_unsel, the selected word line WL_sel and the non-selected bit lines BL_unsel are pre-charged to a pre-charge voltage (e.g., one-half of the reset write voltage Vreset or Vreset/2). In a second pre-charge mode PRE2, only a voltage level $Vunsel\_{WL}$ of the non-selected word lines WL_unsel is pulled down to ground voltage Vss, and voltage levels $Vsel\_{WL}$, $Vunsel\_{BL}$ and $Vsel\_{BL}$ of the selected word line WL_sel, the non-selected bit lines BL_unsel and the selected bit line BL_sel are maintained at the pre-charge voltage (i.e., Vset/2).

In an active mode ACT, the voltage level $Vsel\_{WL}$ of the selected word line WL_sel changes to the reset voltage Vreset, the non-selected bit lines BL_unsel is maintained at the pre-charge voltage (i.e., Vset/2), the voltage level $Vsel\_{BL}$ of the selected bit line BL_sel changes to a voltage near ground voltage Vss, and the non-selected word lines WL_unsel are maintained at ground voltage Vss.

Hereinafter, the reset write operation according to an embodiment of the inventive concept will be described with reference to FIGS. 16 and 17.

The reset write voltage Vreset is applied to the selected word line WL_sel, and the selected bit line BL_sel is connected to the first write driver 121 generating the reset write current Ireset. As a result, the reset write current Ireset will flow through the selected bit line BL_sel, the selected memory cell MC_sel and the selected word line WL_sel. In such a case, the second voltage $Vsel\_{BL}$ near ground voltage Vss will be induced at the selected bit line BL_sel, and a data value of '0' will be stored in the selected memory cell MC_sel by the reset write current Ireset generated from the first write driver 121.

During the reset write operation, the voltage level $Vsel\_{WL}$ of the selected word line WL_sel will be higher than the voltage level $Vsel\_{BL}$ of the selected bit line BL_sel. Thus, the write driver 12, that is, the first write driver 121 is connected to the selected bit line BL_sel. As described above, according to the present embodiment, the first write driver 121 is not connected to a high voltage line of the selected bit line BL_sel and the selected word line WL_sel but connected to a low voltage line of the selected bit line BL_sel and the selected word line WL_sel during the reset write operation. That is, the reset write current Ireset generated from the first write driver 121 is not forced into the selected word line WL_sel but drained from the selected bit line BL_sel. Thus, most of the reset write current Ireset generated from the first write driver 121 connected to the low voltage line (i.e., the selected bit line BL_sel) will flow through the selected memory cell MC_sel to minimize the leakage currents flowing through the non-selected memory cells, the first half-selected memory cells MC_hsel1, and the second half-selected memory cells MC_hsel2.

Moreover, the fourth inhibition voltage Vinh4, for example, the ground voltage Vss may be applied to the non-selected word lines WL_unsel, and the second voltage $Vsel\_{BL}$ close to the ground voltage Vss may be induced at the selected bit line BL_sel. In such a case, a voltage deference between the fourth inhibition voltage Vinh4 and the second voltage $Vsel\_{BL}$ may be less than the threshold voltage of the selection elements D. In some embodiments, the voltage deference between the fourth inhibition voltage Vinh4 and the second voltage $Vsel\_{BL}$ may be within the second sub-threshold region STR2 of the selection elements D.

For example, the fourth inhibition voltage Vinh4 may be the ground voltage Vss, the second voltage $Vsel\_{BL}$ may be close to the ground voltage Vss, and the second voltage $Vsel\_{BL}$ may be higher than the fourth inhibition voltage Vinh4. Thus, the voltage deference between the fourth inhibition voltage Vinh4 and the second voltage $Vsel\_{BL}$ may be within the second sub-threshold region STR2 of the selection elements D. As a result, the selection elements D included in the second half-selected memory cells MC_hsel2 coupled between the non-selected word lines WL_unsel and the selected bit line BL_sel is turned OFF to minimize the leakage currents flowing through the second half-selected memory cells MC_hsel2.

Furthermore, the third inhibition voltage Vinh3 (e.g., one-half of the reset write voltage of Vreset/2) is applied to the non-selected bit line BL_unsel, and the reset write voltage Vreset is applied to the selected word line WL_sel. Thus, a voltage difference between the third inhibition voltage Vinh3 and the reset write voltage Vreset will be under these assumptions one-half of the reset write voltage (i.e., Vreset/2). In such a case, leakage currents will flow through the first half-selected memory cells MC_hsel1.

However, according to the present embodiment, the first write driver 121 is connected to a low voltage line of the selected word line WL_sel and the selected bit line BL_sel during the reset write operation. Thus, most of the reset write current Ireset supplied from the first write driver 121 will flow through the selected memory cells MC_sel to remarkably reduce the leakage currents flowing through the first half-selected memory cells MC_hsel1 coupled between the non-selected bit lines BL_unsel and the selected word line WL_sel.

Figure 18:
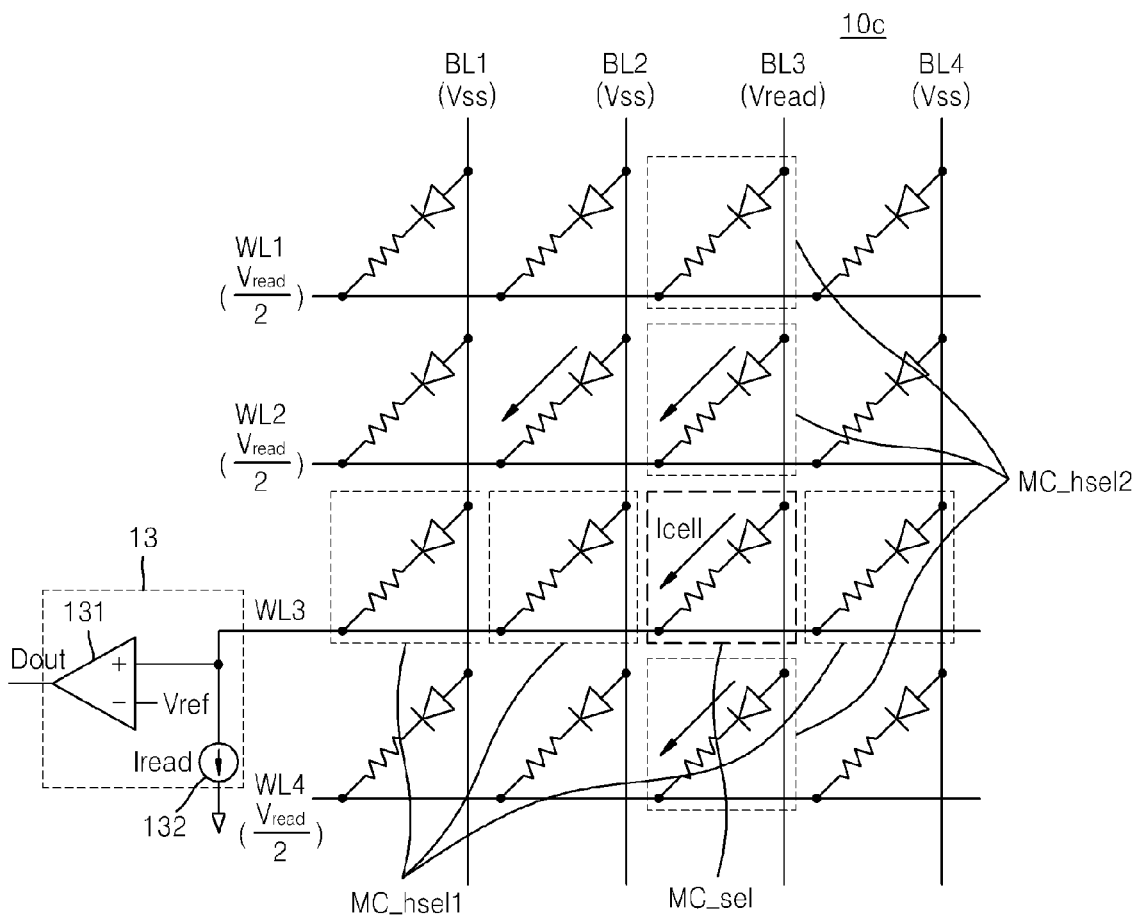
FIG. 18 illustrates an equivalent circuit diagram of a portion of a memory cell array of the memory device shown in FIG. 2 with a bias condition applied during a read operation according to an embodiment of the inventive concept.

FIG. 18 is still another equivalent circuit diagram for a third selected portion 10c of the memory cell array 11 of the memory device 10 shown in FIG. 2 with a bias condition applied during a read operation according to an embodiment of the inventive concept.

Referring to FIG. 18, the first, second and fourth bit lines BL1, BL2 and BL4 are non-selected bit lines BL_unsel and the third bit line BL3 is a selected bit line BL_sel. In addition, the first, second and fourth word lines WL1, WL2 and WL4 are non-selected word lines WL_unsel and the third word line WL3 is a selected word line WL_sel.

In such a case, a memory cell connected to the selected bit line BL_sel (i.e., the third bit line BL3) and the selected word line WL_sel (i.e., the third word line WL3) will be the selected memory cell MC_sel. Moreover, memory cells coupled between the non-selected bit lines BL_unsel and the non-selected word lines WL_unsel will be non-selected memory cells. Furthermore, memory cells coupled between the non-selected bit lines BL_unsel and the selected word line WL_sel are first half-selected memory cells MC_hsel1, and memory cells coupled between the non-selected word lines WL_unsel and the selected bit line BL_sel will be second half-selected memory cells MC_hsel2.

Here, the read voltage Vread is applied to the selected bit line BL_sel and a first inhibition voltage Vinh1 is applied to the non-selected bit lines BL_unsel. In addition, a second inhibition voltage Vinh2 is applied to the non-selected word line WL_unsel.

If the read voltage Vread is applied to the selected bit line BL_sel, the sense amplification unit 13 will be electrically connected to the selected word line WL_sel. The sense amplification unit 13 will then sense and amplify a cell current Icell flowing through the selected memory cell MC_sel and the selected word line WL_sel to read out the data value stored in the selected memory cell MC_sel.

During the read operation, a voltage level of the selected bit line BL_sel will be higher than a voltage level of the selected word line WL_sel, and the sense amplification unit 13 will be electrically connected to the selected word line WL_sel. Accordingly, the sense amplification unit 13 receives the cell current Icell drained from the selected word line WL_sel to sense and amplify a voltage level of the selected word line WL_sel. As a result, most of the cell current Icell flowing through the selected memory cell MC_sel will flow into the sense amplification unit 13 to reduce a probability of read errors.

The sense amplification unit 13 of FIG. 18 includes a sense amplifier 131 and a read driver 132. The cell current Icell flows to a ground voltage Vss terminal through the read driver 132. The sense amplifier 131 may be used to compare a voltage of the selected word line WL_sel with a reference voltage Vref in order to read a data value Dout stored in the selected memory cell MC_sel.

In addition, a first inhibition voltage Vinh1, for example, ground voltage Vss may be applied to the non-selected bit lines BL_unsel. In such a case, a voltage difference between the first inhibition voltage Vinh1 and a voltage induced at the selected word line WL_sel will be less than the threshold voltage of the selection elements D. In some embodiments, the voltage difference between the first inhibition voltage Vinh1 and a voltage induced at the selected word line WL_sel may fall within the second sub-threshold region STR2 of the selection elements D.

For example, the first inhibition voltage Vinh1 may be ground voltage Vss, the voltage induced at the selected word line WL_sel may be near ground voltage Vss, and the voltage induced at the selected word line WL_sel may be higher than the first inhibition voltage Vinh1. Thus, the voltage deference between the first inhibition voltage Vinh1 and the voltage induced at the selected word line WL_sel may fall within the second sub-threshold region STR2 of the selection elements D. As a result, the selection elements D included in the first half-selected memory cells MC_hsel1 coupled between the non-selected bit lines BL_unsel and the selected word line WL_sel are turned OFF to minimize the leakage currents flowing through the first half-selected memory cells MC_hsel1.

Furthermore, the second inhibition voltage Vinh2 (e.g., one-half of the read voltage or Vread/2) may be applied to the non-selected word lines WL_unsel, and the read voltage Vread may be applied to the selected bit line BL_sel. Thus, a voltage difference between the second inhibition voltage Vinh2 and the read voltage Vread may be, for example, one-half of the read voltage (i.e., Vread/2). In such a case, leakage currents will flow through the second half-selected memory cells MC_hsel2.

However, according to the present embodiment, the sense amplification unit 13 will be connected to a low voltage line of the selected word line WL_sel and the selected bit line BL_sel during the read operation. Thus, most of the read current Iread supplied from the read driver 132 may flow through the selected memory cells MC_sel to remarkably reduce the leakage currents flowing through the second half-selected memory cells MC_hsel2 coupled between the non-selected word lines WL_unsel and the selected bit line BL_sel.

FIG. 19 is a flowchart summarizing a method of operating a memory device according to an embodiment of the inventive concept.

Referring to FIG. 19, the method of operating the memory device according to an embodiment of the inventive concept corresponds to a method of performing a set write operation of a cell array. This type of method may be applied to the memory device 10 previously described with reference to the various embodiments shown in FIGS. 1 through 18.

In the exemplary method, a first set write voltage is applied to a selected first signal line (S110). For example, the selected first signal line may be one of the plurality of bit lines BL. In such a case, the column decoder 17 activates the selected bit line BL_sel in response to the column address signal Y_ADDR. In some embodiments, if the memory device 10 includes multi-level cells, a second set write voltage higher than the first set write voltage may be applied to the selected bit line BL_sel according to the data value to be programmed.

A first inhibition voltage Vinh1 is applied to non-selected first signal lines (S130). For example, the non-selected first signal lines may be the bit lines BL. In such a case, the first inhibition voltage Vinh1 may be the ground voltage Vss. However, the first inhibition voltage Vinh1 is not limited Vss, the first inhibition voltage Vinh1 vary according to the set write current Iset supplied from the write driver 12 or a configuration of the write driver 12.

A first voltage $Vsel_{\_WL}$ of a selected second signal line may be controlled so that the first voltage $Vsel_{\_WL}$ is lower than the first set write voltage and the difference between the first inhibition voltage Vinh1 and the first voltage is less than a threshold voltage of the selection element D (S150). For example, the selected second signal line may be one of the plurality of word lines WL. The first voltage $Vsel_{\_WL}$ may vary according to the set write current Iset supplied from the write driver 12 or a configuration of the write driver 12.

A voltage difference between the first inhibition voltage Vinh1 and the first voltage $Vsel_{\_WL}$ may be lower than the threshold voltage of the selection elements D included in the memory cells MC. For example, the voltage difference between the first inhibition voltage Vinh1 and the first voltage $Vsel_{\_WL}$ may be within the range of the second sub-threshold region STR2 of the selection elements D. Thus, the leakage currents flowing through the half-selected memory cells coupled between the non-selected bit lines BL_unsel and the selected word line WL_sel may be minimized A resistive state for the selected memory cell may be changed from a first resistive state to a second resistive state lower than the first resistive state such that a data value is stored in the selected memory cell. A resistance value of the first resistive state may be higher than a resistance value of the second resistive state. Thus, the above write operation may be referred to as a set operation or a set write operation.

If the memory device includes multi-level cells, a second set write voltage higher than the first set write voltage may be applied to the selected bit line BL_sel according to the data value to be programmed. In such a case, the resistive state of the selected memory cell may be changed from a second resistive state to a third resistive state lower than the second resistive state such that the data value stored in the selected memory cell.

FIG. 20 is another flowchart summarizing a method of operating a memory device according to another embodiment of the inventive concept.

Referring to FIG. 20, the method of operating the memory device according to an embodiment of the inventive concept corresponds to a method of performing a reset write operation for a memory cell array. This method may be applied to the memory device 10 described with reference to FIGS. 1 through 18.

A reset write voltage is applied to a selected second signal line (S210). For example, the selected second signal line may be one of the plurality of word lines WL. In such a case, the row decoder 16 may activate the selected word line WL_sel in response to the row address signal X_ADDR. In some embodiments, if the memory device 10 includes multi-level cells, another reset write voltage higher than the reset write voltage may be applied to the selected word line WL_sel according to a piece of data to be programmed.

A second voltage $Vsel\_{BL}$ is applied to a selected first signal line (S230). For example, the selected first signal line may be one of the plurality of bit lines BL. In such a case, the column decoder 17 may activate the selected bit line BL_sel in response to the column address signal Y_ADDR. The second voltage $Vsel\_{BL}$ may vary according to the reset write current Ireset supplied from the write driver 12 or a configuration of the write driver 12. Although not shown in FIG. 20, a fourth inhibition voltage Vinh4 may be applied to non-selected second signal lines. For example, the non-selected second signal lines may be the word lines WL. In such a case, the fourth inhibition voltage Vinh4 may be the ground voltage Vss.

A voltage difference between the fourth inhibition voltage Vinh4 and the second voltage $Vsel\_{BL}$ may be lower than the threshold voltage of the selection elements D included in the memory cells MC. For example, the voltage difference between the fourth inhibition voltage Vinh4 and the second voltage $Vsel\_{BL}$ may be within the range of the second sub-threshold region STR2 of the selection elements D. Thus, the leakage currents flowing through the half-selected memory cells coupled between the non-selected word lines WL_unsel and the selected bit line BL_sel may be minimized A resistive state of the selected memory cell may be changed from a first resistive state to a second resistive state higher than the first resistive state such that a piece of second data is stored in the selected memory cell. A resistance value of the second resistive state may be higher than a resistance value of the first resistive state. Thus, the above write operation may be referred to as a reset operation or a reset write operation.

Figure 21:
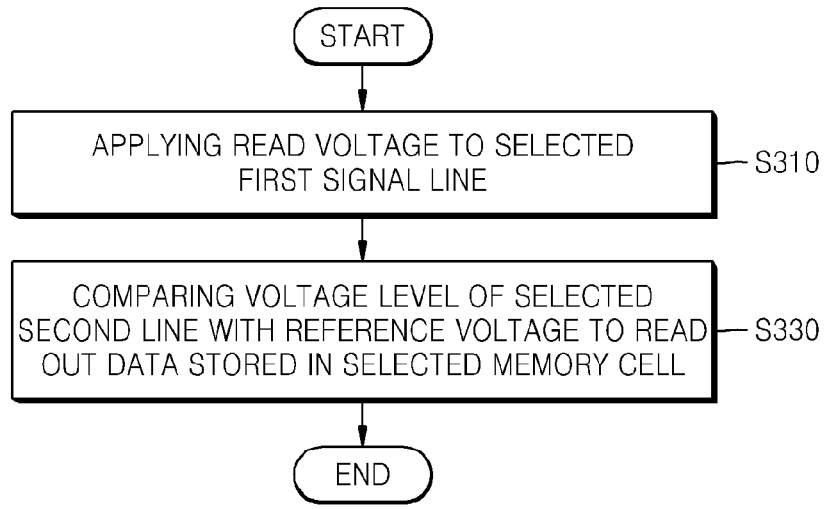
FIG. 21 is a flowchart illustrating a method of operating a memory device according to yet another embodiment of the inventive concept.

FIG. 21 is still another flowchart summarizing a method of operating a memory device according to an embodiment of the inventive concept, wherein the method of operating the memory device corresponds to a method of performing a read operation for a memory cell array.

A read voltage is applied to a selected first signal line (S310). For example, the selected first signal line may be one of the plurality of bit lines BL. In such a case, the column decoder 17 may activate the selected bit line BL_sel in response to the column address signal Y_ADDR.

A voltage level of a selected second line may be compared with a reference voltage Vref to read out a piece of data stored in a selected memory cell (S330). For example, the selected second signal line may be one of the plurality of word lines WL. In such a case, the sense amplification unit 13 may compare the voltage level of the selected word line WL_sel with the reference voltage Vref to read out the piece of data stored in the selected memory cell MC_sel.

Figure 22:
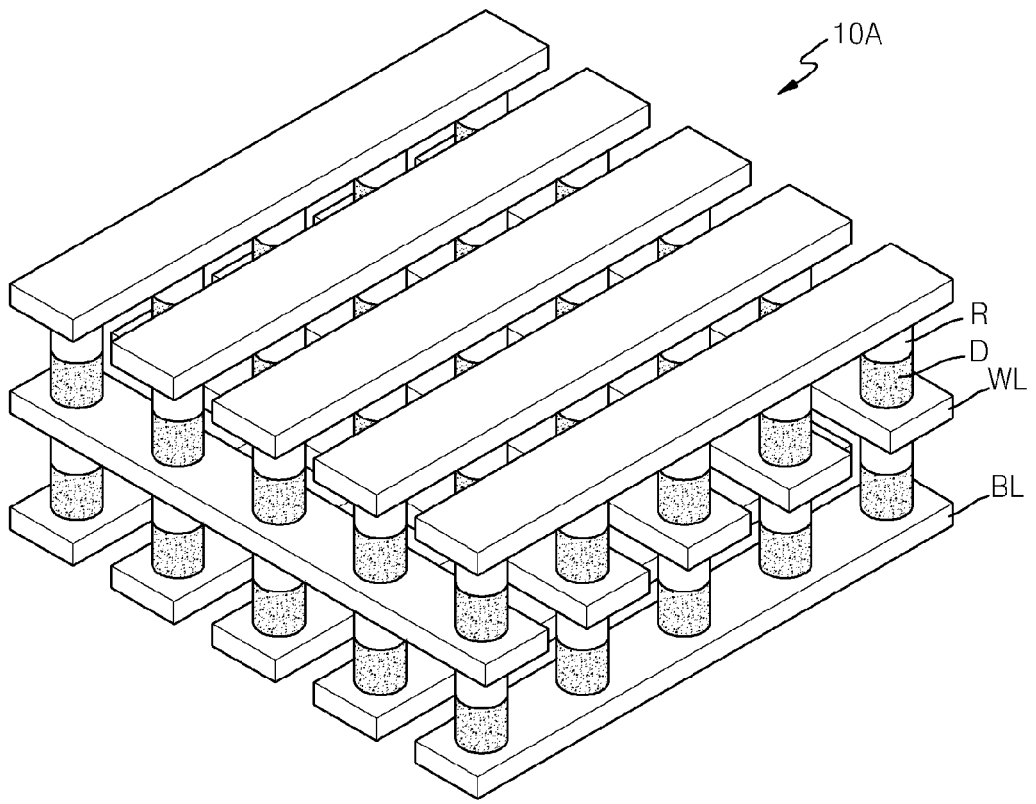
FIG. 22 is a perspective view illustrating an example of a memory device included in the semiconductor system of FIG. 1.

FIG. 22 is a perspective view illustrating one example of a memory device 10A that may be employed in the memory system of FIG. 1.

Referring to FIG. 22, the memory device 10A may include a plurality of bit lines BL, a plurality of word lines WL and a plurality of memory cells. The plurality of bit lines BL may be disposed to interest the plurality of word lines WL. The plurality of memory cells may be disposed at respective ones of intersections of the plurality of bit lines BL and the plurality of word lines WL, and each of the plurality of memory cells may include a diode D and a variable resistor R which are connected in series.

Figure 23:
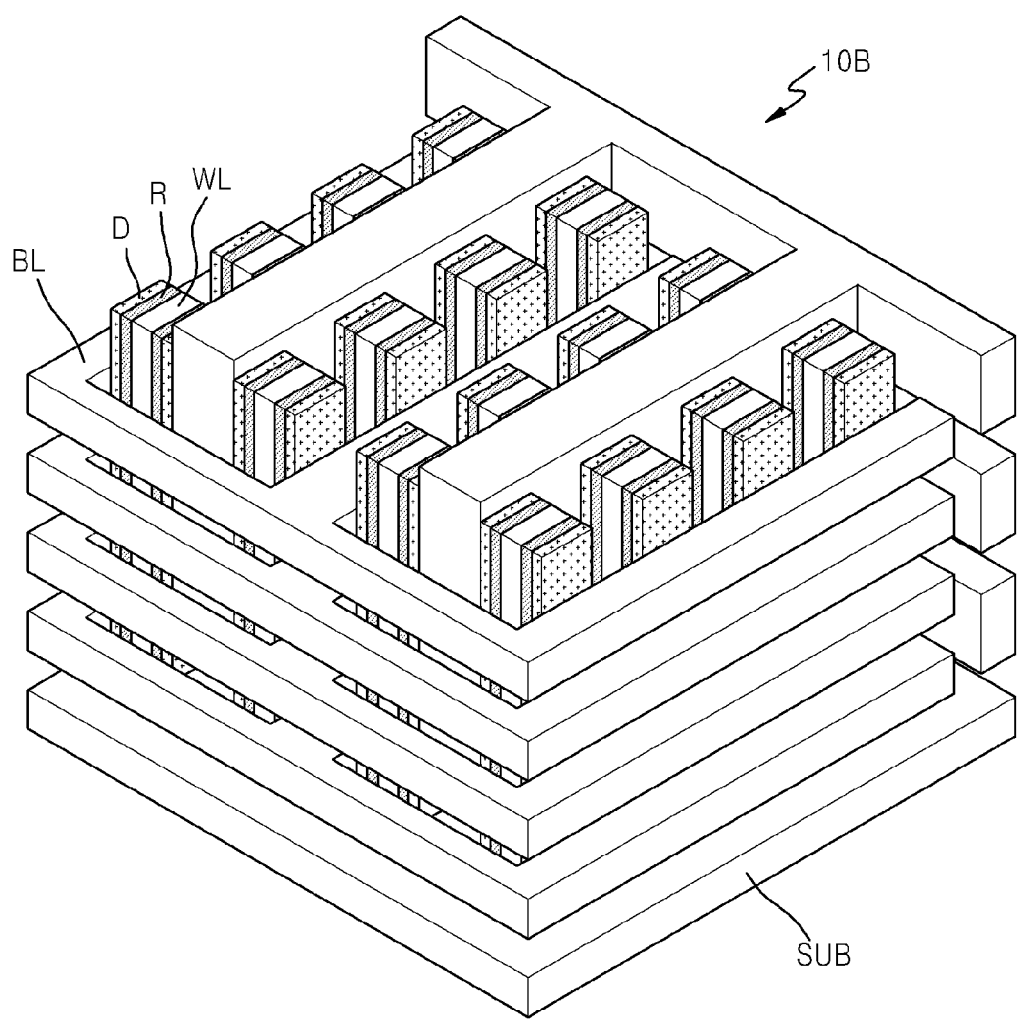
FIG. 23 is a perspective view illustrating another example of a memory device included in the semiconductor system of FIG. 1.

FIG. 23 is a perspective view illustrating another example of a memory device 10B that may be employed in the memory system of FIG. 1.

Referring to FIG. 23, the memory device 10B may include a plurality of bit lines BL disposed to be parallel with a substrate SUB, a plurality of word lines WL disposed to be perpendicular to the substrate SUB, and a plurality of memory cells disposed between the bit lines BL and the word lines WL. Each of the memory cells may include a diode material D and a variable resistive material R which are disposed to be perpendicular to the substrate SUB. The variable resistive material R may be an amorphous silicon material doped with vanadium (V), cobalt (Co), nickel (Ni), palladium (Pd), iron (Fe) or manganese (Mn). Alternatively, the variable resistive material R may be a perovskite material such as $Pr_{1-x}Ca_xMnO_3$, $La_{1-x}Ca_xMnO_3$(LCMO), $LaSrMnO_3$ (LSMO) or $GdBaCo_xO_y$(GBCO).

Figure 24:
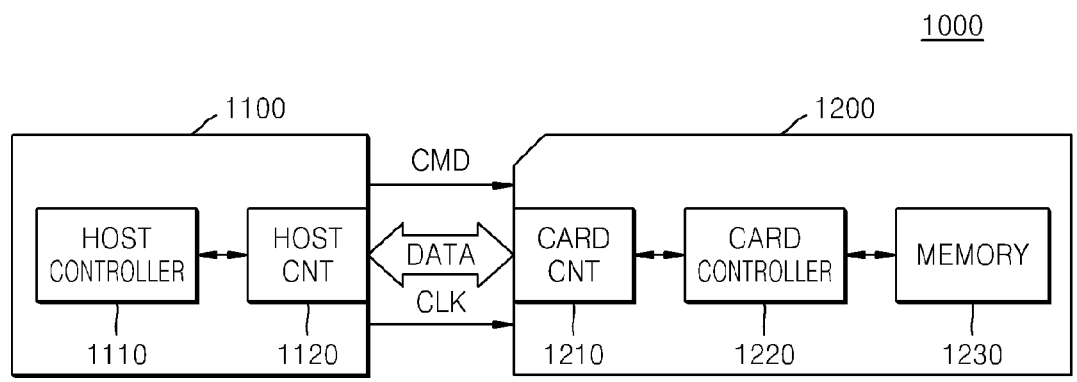
FIG. 24 is a block diagram illustrating a memory card system including a memory system according to some embodiments of the inventive concept.

FIG. 24 is a block diagram illustrating a memory card system 1000 that may be configured to include a memory system according to some embodiments of the inventive concept.

Referring to FIG. 24, the memory card system 1000 may include a host 1100 and a memory card 1200. The host 1100 may include a host controller 1110 and a host connector 1120. The memory card 1200 may include a card connector 1210, a card controller 1220 and a memory device 1230. The memory card 1200 may be realized using the embodiments illustrated in FIGS. 1 to 23.

The host 1100 may write data in the memory card 1200 or may read out data stored in the memory card 1200. The host controller 1110 may transmit a command signal CMD, a clock signal CLK generated from a clock generator (not shown) in the host 110, and data DATA to the memory card 1200 through the host connector 1120.

The card controller 1220 may receive the command signal CMD through the card connector 1210 to store the data DATA in the memory device 1230 in synchronization with a clock signal generated from a clock generator (not shown) in the card controller 1220. That is, the memory device 1230 may store the data DATA received from the host 1100 therein.

The memory card 1200 may be a compact flash card (CFC), a Microdrive, a smart media card (SMC), a multimedia card (MMC), a security digital card (SDC), a memory stick (MC) or a universal serial bus (USB).

Figure 25:
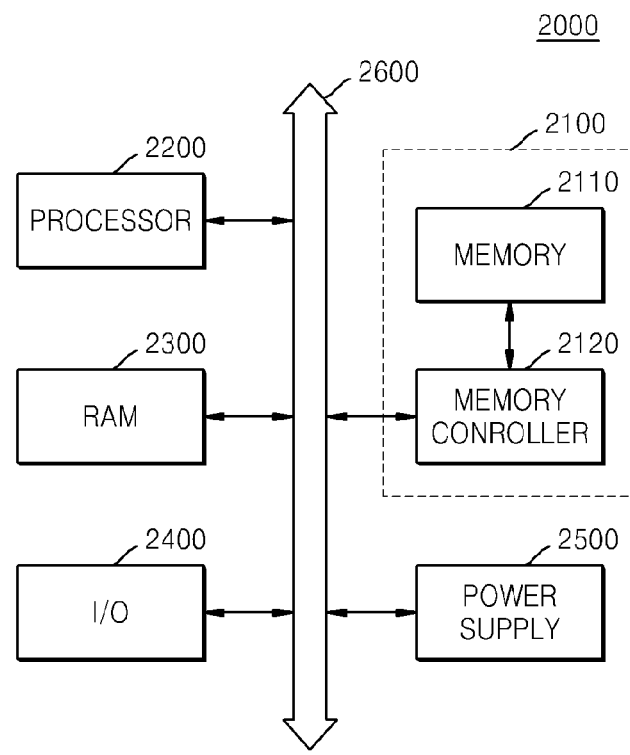
FIG. 25 is a block diagram illustrating a computing system including a memory system according to some embodiments of the inventive concept.

FIG. 25 is a block diagram illustrating a computing system 2000 that may be configured to include a memory system according to some embodiments of the inventive concept.

Referring to FIG. 25, the computing system 2000 may include a memory system 2100, a processor 2200, a random access memory (RAM) 2300, an input/output (I/O) device 2400 and a power supply device 2500. Although not shown in FIG. 25, the computing system 2000 may further include ports which are capable of communicating with a video card, a sound card, a memory card, a USB device or other electronic systems. The computing system 2000 may be a portable electronic system such as a personal computer, a notebook computer, a mobile phone, a personal digital assistant (PDA) or a digital camera.

The processor 2200 may execute specific calculations or specific tasks. In some embodiments, the processor 2200 may be a micro-processor or a central processing unit (CPU). The processor 2200 may communicate with the RAM 2300, the I/O device 2400 and the memory system 2100 through a bus 2600 such as an address bus, a control bus or a data bus. The memory system 2100 may be realized using the embodiments illustrated in FIGS. 1 to 23.

In some embodiments, the processor 2200 may be connected to an expansion bus such as a peripheral component interconnect (PCI) bus.

The RAM 2300 may store data necessary for operations of the computing system 2000 therein. For example, the RAM 2300 may be realized using a DRAM device, a mobile DRAM device, an SRAM device, a PRAM device, an FRAM device, an RRAM device and/or an MRAM device.

The I/O device 2400 may include an input device such as a keyboard, a keypad or a mouse and an output device such as a printer or a display unit. The power supply device 2500 may supply a power supply voltage necessary for operations of the computing system 2000.

Figure 26:
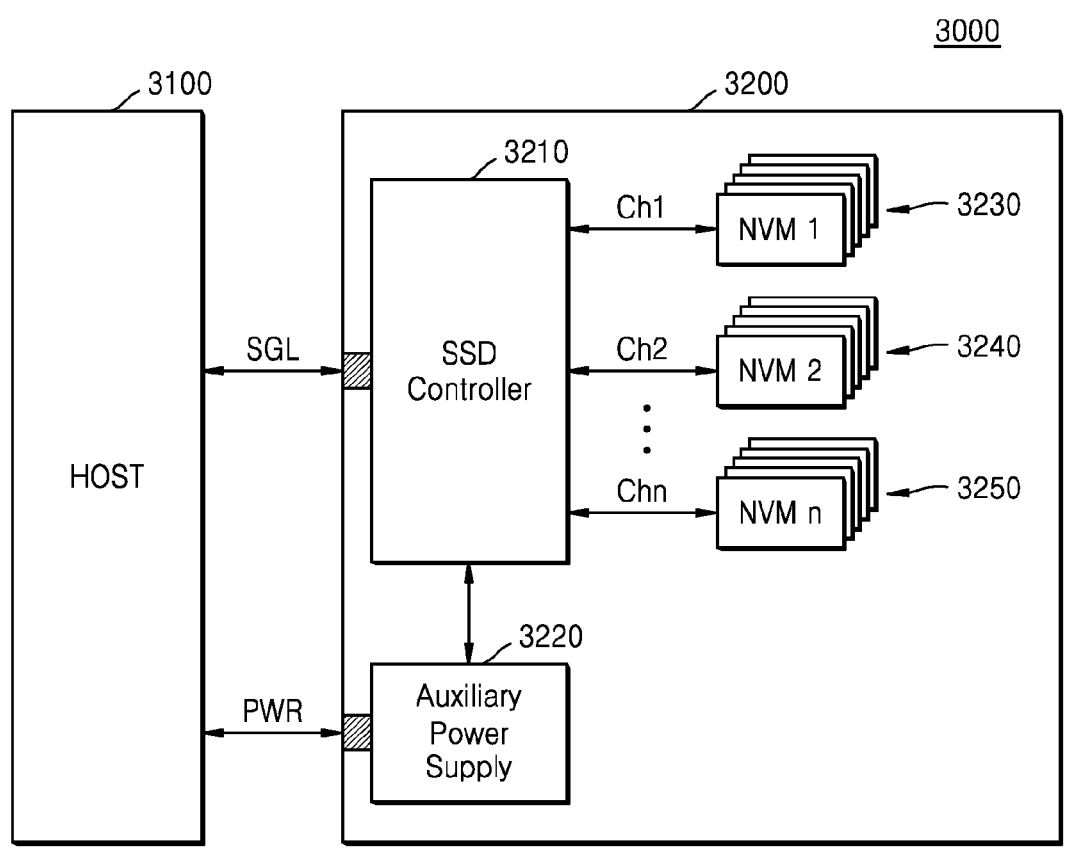
FIG. 26 is a block diagram illustrating a solid state drive system including a memory system according to some embodiments of the inventive concept.

FIG. 26 is a block diagram illustrating a solid state drive (SSD) system 3000 that may be configured to include a memory system according to some embodiments of the inventive concept.

Referring to FIG. 26, the SSD system 3000 may include a host 3100 and an SSD 3200. The SSD 3200 may transmit signals SGL to the host 3100 through a signal connector or may receive the signals SGL received from the host 3100 through the signal connector. In addition, the SSD 3200 may receive a power supply voltage signal PWR received from the host 3100 through a power connector. The SSD system 3200 may include an SSD controller 3210, an auxiliary power supply device 3220 and a plurality of memory devices 3230, 3240 and 3250. The SSD 3200 may be realized using the embodiments illustrated in FIGS. 1 to 23.

While the inventive concept has been particularly shown and described with reference to exemplary embodiments thereof, it will be understood that various changes in form and details may be made therein without departing from the scope of the following claims.

What is claimed is:

1. A method of operating a memory device including memory cells disposed at respective intersections of bit lines and word lines, wherein each memory cell includes a variable resistor and a selection element, the method comprising:
   during a first pre-charge mode, applying a pre-charge voltage to a selected bit line connected to a selected memory cell among the memory cells, non-selected bit lines, and a selected word line connected to the selected memory cell;
   during a second pre-charge mode following the first pre-charge mode, reducing the pre-charge voltage applied to the non-selected bit lines to a first inhibition voltage; and
   during an active mode following the second pre-charge mode, applying a first set write voltage greater than the pre-charge voltage to the selected bit line and reducing the pre-charge voltage applied to the selected word line to a voltage higher than the first inhibition voltage.

2. The method of claim 1, further comprising:
   applying a set write current to the selected word line.

3. The method of claim 2, wherein when the first set write voltage is applied to the selected bit line and the set write current flows through the selected memory cell, a resistive state of the selected memory cell changes from a first resistive state to a second resistive state lower than the first resistive state, such that a first data value is stored in the selected memory cell.

4. The method of claim 3, further comprising:
   applying a second set write voltage higher than the first set write voltage to the selected bit line,
   wherein when the second set write voltage is applied to the selected bit line and the voltage higher than the first inhibition voltage is applied to the selected word line, a resistive state of the selected memory cell changes from the second resistive state to a third resistive state lower than the second resistive state.

5. The method of claim 1, further comprising:
   applying a second inhibition voltage to non-selected word lines.

6. The method of claim 5, wherein the second inhibition voltage is substantially equal to half of the first set write voltage.

7. The method of claim 1, wherein the first inhibition voltage is substantially equal to a ground voltage.

8. The method of claim 1, further comprising:
   applying a reset write voltage to the selected word line;
   applying a second voltage lower than the reset write voltage to the selected bit line;
   applying a third inhibition voltage to the non-selected bit lines; and
   applying a fourth inhibition voltage to non-selected word lines.

9. The method claim of claim 8, wherein the third inhibition voltage is substantially equal to half of the reset write voltage, and the fourth inhibition voltage is substantially equal to ground voltage.

10. The method of claim 8, wherein when the reset write voltage is applied to the selected word line and the second voltage is applied to the selected bit line, a resistive state of the selected memory cell changes from a first resistive state to a second resistive state higher than the first resistive state.

11. The method of claim 1, further comprising:
    applying a read voltage to the selected bit line; and
    electrically connecting the selected word line to a sense amplification unit, wherein the sense amplification unit compares a voltage level of the selected word line with a reference voltage to read a data value stored in the selected memory cell.

12. The method of claim 11, wherein a read current flows through the selected memory cell when the read voltage is applied to the selected bit line, and the read current flows to ground voltage through a read driver included in the sense amplification unit.

13. A method of operating a memory device including memory cells disposed at respective intersections of bit lines and word lines, wherein each memory cell includes a variable resistor and a selection element, the method comprising:
    during a first pre-charge mode, applying a pre-charge voltage to a selected word line connected to a selected memory cell among the memory cells, non-selected word lines, and a selected bit line connected to the selected memory cell;
    during a second pre-charge mode following the first pre-charge mode, reducing the pre-charge voltage applied to the non-selected word lines to a first inhibition voltage; and
    during an active mode following the second pre-charge mode, applying a set write voltage greater than the pre-charge voltage to the selected word line and reducing the pre-charge voltage applied to the selected bit line to a voltage higher than the first inhibition voltage.

14. The method of claim 13, further comprising:
    applying a set current to the selected bit line.

15. The method of claim 14, wherein when the set write voltage is applied to the selected word line and the set write current flows through the selected memory cell, a resistive state of the selected memory cell changes from a first resistive state to a second resistive state lower than the first resistive state, such that a first data value is stored in the selected memory cell.

16. The method of claim 13, further comprising:
applying a second inhibition voltage to non-selected bit lines.

17. The method of claim 16, wherein the second inhibition voltage is substantially equal to half of the set write voltage.

18. The method of claim 13, wherein the first inhibition voltage is substantially equal to a ground voltage.

19. The method of claim 18, wherein the pre-charge voltage is substantially equal to half of the set write voltage.

20. A method of operating a memory device including resistive memory cells disposed at respective intersections of bit lines and word lines, the method comprising:
during a set write operation, applying a set write voltage to a selected bit line, and connecting a write driver to a selected word line; and
during a reset write operation, applying a reset write voltage to the selected word line, and connecting the write driver to the selected bit line,
wherein the write driver provides a set current to the selected word line during the set write operation, and provides a reset current to the selected bit line during the reset write operation.

* * * * *